United States Patent
Akino

(10) Patent No.: US 8,034,420 B2
(45) Date of Patent: Oct. 11, 2011

(54) BENZOTRIAZOLE COMPOUND-CONTAINING COMPOSITION AND LIGHT-EMITTING DEVICE USING THE COMPOSITION

(75) Inventor: Nobuhiko Akino, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 12/525,770

(22) PCT Filed: Feb. 5, 2008

(86) PCT No.: PCT/JP2008/051837
§ 371 (c)(1),
(2), (4) Date: Aug. 25, 2009

(87) PCT Pub. No.: WO2008/096736
PCT Pub. Date: Aug. 14, 2008

(65) Prior Publication Data
US 2010/0073603 A1    Mar. 25, 2010

(30) Foreign Application Priority Data

Feb. 6, 2007  (JP) ................................. 2007-026559
Feb. 6, 2007  (JP) ................................. 2007-026560

(51) Int. Cl.
*C09K 11/06* (2006.01)
*G02F 1/13357* (2006.01)
*H01L 51/50* (2006.01)
*H01L 51/54* (2006.01)
*C08L 101/02* (2006.01)

(52) U.S. Cl. ............. 428/1.1; 428/917; 349/69; 349/71; 252/301.29; 252/301.35; 313/504; 526/261

(58) Field of Classification Search .................... 428/1.1, 428/1.3, 690, 917; 257/40, E51.026, E29.273; 349/69, 71; 252/301.29, 301.35; 313/504
See application file for complete search history.

(56) References Cited

U.S. PATENT DOCUMENTS

| 6,383,666 | B1 * | 5/2002 | Kim et al. ..................... 428/690 |
| 7,348,070 | B2 * | 3/2008 | Ise et al. ...................... 428/690 |
| 7,714,099 | B2 * | 5/2010 | Morishita et al. ............. 528/423 |
| 2002/0117662 | A1 | 8/2002 | Nii | |
| 2005/0123792 | A1 | 6/2005 | Deaton et al. | |
| 2005/0123798 | A1 | 6/2005 | Deaton et al. | |
| 2005/0175856 | A1 | 8/2005 | Rogers et al. | |

FOREIGN PATENT DOCUMENTS

| JP | 11-199567 | A | 7/1999 |
| JP | 2002-050483 | A | 2/2002 |
| JP | 2002-241455 | A | 8/2002 |
| JP | 2004-214050 | A | 7/2004 |
| JP | 2004-311404 | A | 11/2004 |
| JP | 2005-082701 | A | 3/2005 |
| JP | 2005-251609 | A | 9/2005 |
| JP | 2006-077171 | A | 3/2006 |
| WO | 2006/117914 | A1 | 11/2006 |

OTHER PUBLICATIONS

English translation by computer for JP 2005082701, http://www.4.ipdl.inpit.go.jp/Tokujitu/PAJdetail.ipdl?N0000=60&N0120=01&N2001=2&N3001=2005-082701.*

Fang-Chung Chen, et al., "High-performance polymer light-emitting diodes doped with a red phosphorescent iridium complex," Applied Physics Letters, Apr. 1, 2002, pp. 2308-2310, vol. 80, No. 13.

* cited by examiner

*Primary Examiner* — Shean C Wu
(74) *Attorney, Agent, or Firm* — Sughrue Mion, PLLC

(57) ABSTRACT

Disclosed is a composition containing a compound having a benzotriazole ring structure and a phosphorescent compound.

19 Claims, No Drawings

BENZOTRIAZOLE COMPOUND-CONTAINING COMPOSITION AND LIGHT-EMITTING DEVICE USING THE COMPOSITION

TECHNICAL FIELD

The present invention relates to a benzotriazole compound-containing composition and a light-emitting device using the composition.

BACKGROUND ART

A light-emitting device comprising a compound that exhibits light emission from a triplet excited state (hereinafter, also referred to as a "phosphorescence-emitting compound") used as a light-emitting material for a light-emitting layer therein has been known to have high luminous efficiency. When the phosphorescence-emitting compound is used in a light-emitting layer, a composition comprising the compound added to a matrix is usually used as a light-emitting material. A polymer such as polyvinylcarbazole is used as the matrix, because a thin film can be formed by application (PATENT DOCUMENT 1).

However, such a polymer has the problem that the lowest unoccupied molecular orbital (hereinafter, also referred to as "LUMO") is high, thus resulting in difficult electron injection. On the other hand, when a conjugated polymer such as polyfluorene is used as the matrix, electrons can be injected relatively easily because of its low LUMO. However, such a conjugated polymer has a small lowest triplet excitation energy and is therefore considered to be unsuitable particularly for use as a matrix for light emission with a wavelength shorter than green light emission (PATENT DOCUMENT 2). For example, a light-emitting material comprising a conjugated polymer polyfluorene and a triplet light-emitting compound (NON-PATENT DOCUMENT 1) has low luminous efficiency.
PATENT DOCUMENT 1: JP-A-2002-50483
PATENT DOCUMENT 2: JP-A-2002-241455
NON-PATENT DOCUMENT 1: APPLIED PHYSICS LETTERS, 80, 13, 2308 (2002)

DISCLOSURE OF THE INVENTION

Problems to be Solved by the Invention

Thus, an object of the present invention is to provide a light-emitting material that is excellent in luminous efficiency when used in the light-emitting devices or the like.

Means for Solving the Problems

The present inventor has conducted diligent studies and consequently completed the present invention by finding that a composition comprising: a compound having a benzotriazole ring structure; and a phosphorescence-emitting compound solves the problems described above.

Specifically, a first aspect of the present invention provides a composition comprising: a compound having a benzotriazole ring structure; and a phosphorescence-emitting compound.

A second aspect of the present invention provides a polymer having a residue of the phosphorescence-emitting compound and the benzotriazole ring structure.

A third aspect of the present invention provides a light-emitting thin film, an organic semiconductor thin film and a light-emitting device using the composition or the polymer.

A fourth aspect of the present invention provides a planar light source, a segment display device, a dot matrix display device and illumination comprising the light-emitting device as well as a liquid-crystal display device comprising the light-emitting device as a backlight.

Advantages of the Invention

A composition and a polymer of the present invention (hereinafter, referred to as a "composition, etc., of the present invention") have high luminous efficiency. Thus, the composition, etc., of the present invention gives light-emitting devices excellent in luminous efficiency, when used in the preparation of light-emitting devices or the like. Moreover, the composition, etc., of the present invention usually has relatively excellent light-emitting properties in green or blue light emission. This is probably due to relatively easy electron injection and a large lowest triplet excitation energy attributed to the low LUMO of a polymer of the present invention as a compound contained in the composition of the present invention.

BEST MODE FOR CARRYING OUT THE INVENTION

Hereinafter, the present invention will be described in detail.

<Composition>

A composition of the present invention comprises: a compound having a benzotriazole ring structure; and a phosphorescence-emitting compound. In the present specification, the benzotriazole ring structure means benzotriazole or a group derived from benzotriazole by removal of some or all (particularly, one or two) hydrogen atoms.

It is preferred that the compound having a benzotriazole ring structure should have at least one benzotriazole ring structure selected from the following general formulas (1-1), (1-2), (1-3), (1-4), (2-1), (2-2), (2-3), (3-1), (3-2), (3-3), (3-4), (4-1) and (4-2)

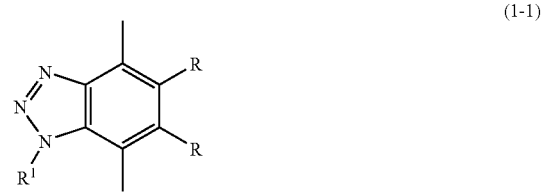
(1-1)

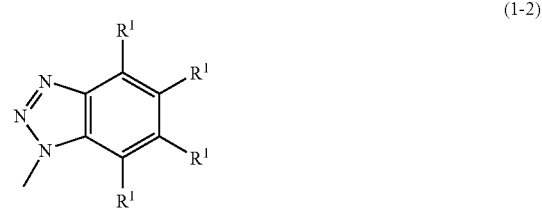
(1-2)

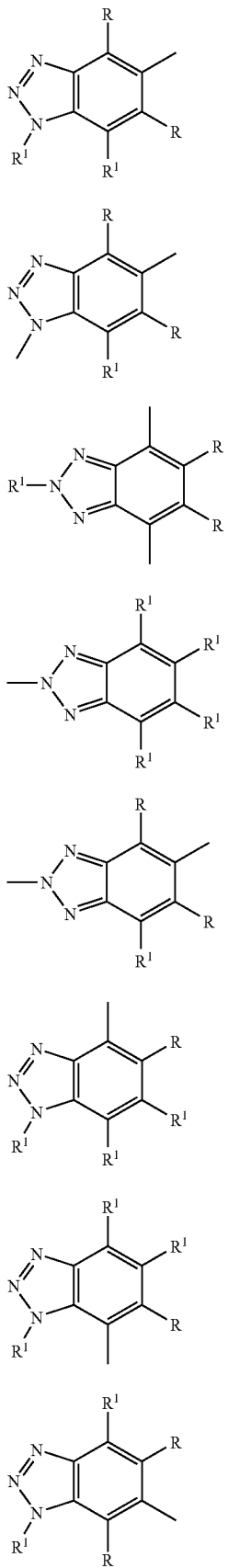

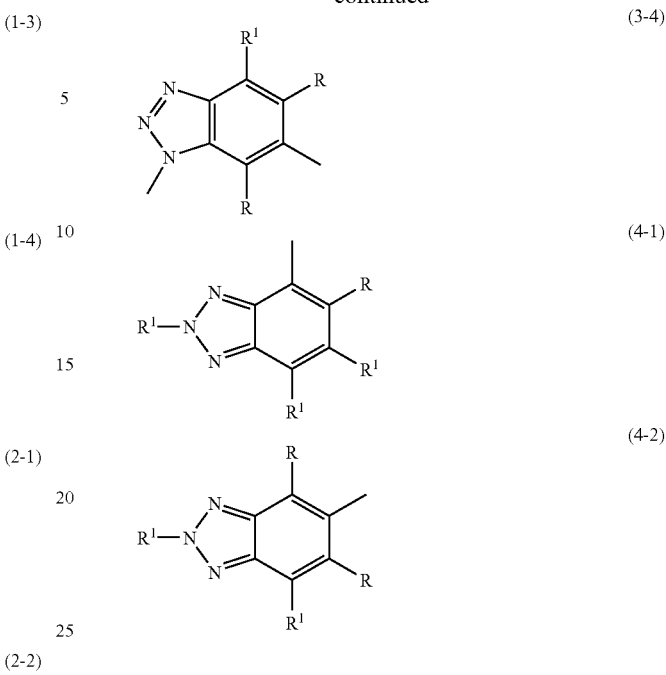

wherein R and R¹ each independently represent a hydrogen atom or a monovalent substituent, and when a plurality of R or R¹ are present, they may be the same or different, ore preferably at least one benzotriazole ring structure selected from the general formulas (1-1), (1-3), (1-4), (2-1), (2-3), (3-1), (3-2), (3-3), (3-4), (4-1) and (4-2). When the compound having a benzotriazole ring structure is a polymer, the compound is preferably a polymer having the benzotriazole ring structure in the main chain and/or the side chain of the polymer.

Examples of the monovalent substituent include a halogen atom, an alkyl group, an alkoxy group, an alkylthio group, an aryl group which may have a substituent, an aryloxy group, an arylthio group, an arylalkyl group, an arylalkyloxy group, an arylalkylthio group, an acyl group, an acyloxy group, an amide group, an acid imide group, an imine residue, a substituted amino group, a substituted silyl group, a substituted silyloxy group, a substituted silylthio group, a substituted silylamino group, a monovalent heterocyclic group which may have a substituent, a heteroaryl group which may have a substituent, a heteroaryloxy group, a heteroarylthio group, an arylalkenyl group, an arylethynyl group, a substituted carboxyl group and a cyano group. Preferably, the monovalent group is an alkyl group, an alkoxy group, an aryl group which may have a substituent or a heteroaryl group which may have a substituent. In this context, the N-valent heterocyclic group (N is 1 or 2) refers to a group derived from a heterocyclic compound by removal of N hydrogen atom(s). This holds true for the present specification.

In the formulas (1-1), (1-2), (1-3), (1-4), (2-1), (2-2), (2-3), (3-1), (3-2), (3-3), (3-4), (4-1) and (4-2), R and R¹ each independently represent a hydrogen atom or a monovalent substituent. Preferably, at least one of a plurality of R and a plurality of R¹ is a monovalent substituent (particularly, at least one of a plurality of R and a plurality of R¹ is an alkyl group having 3 to 10 carbon atoms or an alkoxy group having 3 to 10 carbon atoms), or at least one of R and R¹ is a monovalent substituent (particularly, at least one of R and R¹ is an alkyl group, an alkoxy group, an aryl group which may have a substituent or a heteroaryl group which may have a substituent). Furthermore, it is preferred that at least one of a plurality of R and a plurality of $R^1$ should be an aryl group having a substituent or a heteroaryl group having a substituent. A plurality of R or $R^1$ may be the same or different.

At least one of the R is a monovalent substituent having a total of preferably three or more atoms, more preferably five or more atoms, particularly preferably seven or more atoms, exclusive of hydrogen atoms. When two R are present, preferably at least one of the two R, more preferably both of the two R are the monovalent substituent. A plurality of R or $R^1$ may be the same or different.

Examples of the compound having a benzotriazole ring structure include a compound represented by the following general formula (A-1) or (A-2) and a compound having a residue thereof:

wherein bnztrzl represents a benzotriazole ring structure represented by the general formula (1-2), (1-3), (2-2), (3-1), (3-2), (3-3) or (4-2); when a plurality of bnztrzl are present, they may be the same or different; $Y^1$ represents $-C(R^a)(R^b)-$, $-C(=O)-$, $-N(R^c)-$, $-O-$, $-Si(R^d)(R^e)-$, $-P(R^f)-$, $-S-$ or $-S(=O)_2-$; n is an integer of 0 to 5; $Ar_1$ represents an aryl group which may have a substituent or a monovalent heterocyclic group which may have a substituent; when a plurality of $Y^1$ are present, they may be the same or different; and $R^a$ to $R^f$ each independently represent a hydrogen atom or a monovalent substituent.

In this context, the benzotriazole ring structure contained in one molecule is at least one.

Examples of the aryl group represented by $Ar_1$ include phenyl, $C_1$ to $C_{12}$ alkoxyphenyl (the term "$C_1$ to $C_{12}$ alkoxy" means that the alkoxy moiety has 1 to 12 carbon atoms; the same holds true for description below), $C_1$ to $C_{12}$ alkylphenyl (the term "$C_1$ to $C_{12}$ alkyl" means that the alkyl moiety has 1 to 12 carbon atoms; the same holds true for description below), 1-naphthyl, 2-naphthyl and pentafluorophenyl groups. Phenyl, $C_1$ to $C_{12}$ alkoxyphenyl and $C_1$ to $C_{12}$ alkylphenyl groups are preferable.

The monovalent heterocyclic group represented by $Ar_1$ means an atomic group derived from a heterocyclic compound by removal of one hydrogen atom. In this context, the heterocyclic compound refers to, of organic compounds having a cyclic structure, those endocyclically containing not only a carbon atom but also heteroatoms such as oxygen, sulfur, nitrogen and phosphorus atoms as elements constituting the ring.

Examples of the monovalent heterocyclic group include thienyl, pyrrolyl, furyl, pyridyl, pyrimidyl, pyrazyl, triazyl, indolyl, indazolyl and benzimidazolyl groups.

Examples of the monovalent substituent represented by $R^a$ to $R^f$ include an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a silyloxy group, a substituted silyloxy group, a monovalent heterocyclic group and a halogen atom.

In this context, it is preferred that the compound having a benzotriazole ring structure should have a benzotriazole ring structure other than a residue of a compound represented by the following general formula (A-3)

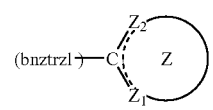

wherein the Z ring is a cyclic structure containing a carbon atom, $Z_1$ and $Z_2$; and $Z_1$ and $Z_2$ each independently represent $-C(H)=$ or $-N=$.

In the formula (A-3), examples of the cyclic structure include an aromatic ring which may have a substituent and a non-aromatic ring which may have a substituent and specifically include a benzene ring, a heterocyclic ring, an alicyclic hydrocarbon ring, condensed rings of these rings in any combination, and these rings whose hydrogen atoms are partially substituted.

The residue of the compound represented by the formulas (A-1) to (A-3) means a group derived from the compound by removal of some or all of hydrogen atoms.

Examples of the compound having a benzotriazole ring structure also include a polymer and a compound represented by the following general formula (6a), (6b) or (6c):

wherein bnztrzl represents a benzotriazole ring structure represented by the general formula (1-2), (1-3), (2-2), (3-1), (3-2), (3-3) or (4-2); X represents a m1-valent aromatic group which may have a substituent or a m1-valent aromatic heterocyclic group which may have a substituent; X' represents a m3-valent aromatic group which may have a substituent or a m3-valent aromatic heterocyclic group which may have a substituent; Ar represents an arylene group which may have a substituent; Z represents a linking group; m1, m2 and m3 are each independently an integer of 2 to 8; when a plurality of Z are present, they may be the same or different; and a plurality of Ar or bnztrzl may be the same or different.

In the formula (6a), the m1-valent aromatic group which may have a substituent, which is represented by X, refers to a group derived from an aromatic ring which may have a substituent by removal of m1 hydrogen atoms. The m1-valent aromatic heterocyclic group which may have a substituent, which is represented by X, refers to a group derived from an aromatic heterocyclic ring which may have a substituent by removal of m1 hydrogen atoms.

In the formula (6c), the m3-valent aromatic group which may have a substituent, which is represented by X', refers to a group derived from an aromatic ring which may have a substituent by removal of m3 hydrogen atoms. The m3-valent aromatic heterocyclic group which may have a substituent, which is represented by X', refers to a group derived from an aromatic heterocyclic ring which may have a substituent by removal of m3 hydrogen atoms.

In the formulas (6b) and (6c), the linking group represented by Z may be conjugated or non-conjugated. When this linking group is divalent, examples thereof include a vinylene group which may have a substituent, $-C(R^a)(R^b)-$, $-C(=O)-$, $-N(R^c)-$, $-O-$, $-Si(R^d)(R^e)-$, $-P(R^f)-$, $-S-$ and $-S(=O)_2-$ ($R^a$ to $R^f$ each independently represent a hydrogen atom or a monovalent substituent).

The compound having a benzotriazole ring structure may have an additional partial structure. The type of the additional partial structure is not particularly limited. The additional partial structure differs in preferable type depending on whether it is present or absent in the end.

When the additional partial structure is present in the end, the additional partial structure is not particularly limited as long as it is a stable substituent. The additional partial structure is preferably the monovalent substituent or the hydrogen atom included in R and $R^1$ from the viewpoint of easy synthesis and so on.

When the additional partial structure is absent in the end, the additional partial structure is not particularly limited as long as it is a stable polyvalent group. The additional partial structure is preferably a polyvalent group having conjugating properties in terms of a LUMO energy level. Examples of such a group include divalent and trivalent aromatic groups. In this context, the aromatic group refers to a group derived from an organic compound that exhibits aromaticity. Examples of such an aromatic group include groups derived from aromatic rings such as benzene, naphthalene, anthracene, pyridine, quinoline and isoquinoline by substitution of n (n is 2 or 3) hydrogen atoms by a bond.

One preferable example of the additional partial structure which may be contained in the compound having a benzotriazole ring structure includes a structure represented by the following formula (5):

(5)

The structure represented by the formula (5) may have a substituent selected from the group consisting of an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group and a cyano group.

In the formula (5), the P ring which may be absent and the Q ring each independently represent an aromatic ring, wherein two bonds are respectively present on the P ring or the Q ring in the presence of the P ring and are respectively present on a Y-containing five-membered or six-membered ring or the Q ring in the absence of the P ring. Moreover, the P ring, the Q ring and the Y-containing five-membered or six-membered ring may have a substituent selected from the group consisting of an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group and a cyano group. Y represents —O—, —S—, —Se—, —B($R^0$)—, —Si($R^2$)($R^3$)—, —P($R^4$)—, —P($R^5$)(=O)—, —C($R^6$)($R^7$)—, —N($R^8$)—, —C($R^9$)($R^{10}$)—C($R^{11}$)($R^{12}$)—, —O—C($R^{13}$)($R^{14}$)—, —S—C($R^{15}$)($R^{16}$)—, —C($R^{17}$)($R^{18}$)—, —Si ($R^{19}$)($R^{20}$)—C($R^{21}$)($R^{22}$)—, —Si($R^{23}$)($R^{24}$)—Si($R^{25}$)($R^{26}$)—, —C($R^{27}$)=C($R^{28}$)—, —N=C($R^{29}$)—, or —Si($R^{30}$)=C ($R^{31}$)—. In this context, $R^0$ and $R^2$ to $R^{31}$ each independently represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a silyloxy group, a substituted silyloxy group, a monovalent heterocyclic group or a halogen atom. Among them, an alkyl group, an alkoxy group, an alkylthio group, an aryl group, an aryloxy group, an arylthio group, an arylalkyl group, an arylalkoxy group, and a monovalent heterocyclic group are preferable. An alkyl group, an alkoxy group, an aryl group and a monovalent heterocyclic group are more preferable, and an alkyl group and an aryl group are particularly preferable.

Examples of the structure represented by the formula (5) include: a structure represented by the following formula (5-1), (5-2) or (5-3):

(5-1)

(5-2)

(5-3)

wherein the A ring, the B ring and the C ring each independently represent an aromatic ring; the formulas (5-1), (5-2) and (5-3) may respectively have a substituent selected from the group consisting of an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group and a cyano group; and Y is as defined above; and structure represented by the following formula (5-4) or (5-5):

(5-4)

(5-5)

wherein the D ring, the E ring, the F ring and the G ring each independently represent an aromatic ring which may have a substituent selected from the group consisting of an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group and a cyano group; and Y is as defined above.

In the formulas (5-4) and (5-5), Y is preferably a carbon atom, a nitrogen atom, an oxygen atom or a sulfur atom from the viewpoint of obtaining high luminous efficiency.

In the formulas (5-1), (5-2), (5-3), (5-4) and (5-5), examples of unsubstituted aromatic rings represented by the A ring, the B ring, the C ring, the D ring, the E ring, the F ring and the G ring include: aromatic hydrocarbon rings such as benzene, naphthalene, anthracene, tetracene, pentacene, pyrene and phenanthrene rings; and heterocyclic aromatic rings such as pyridine, bipyridine, phenanthroline, quinoline, isoquinoline, thiophene, furan and pyrrole rings. These aromatic rings may have the substituent.

Moreover, one preferable example of the additional partial structure which may be contained in the compound having a benzotriazole ring structure includes aromatic amine having a structure represented by the following formula:

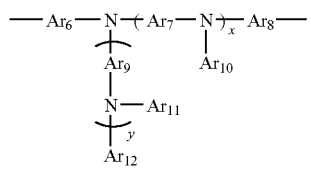

wherein $Ar_6$, $Ar_7$, $Ar_6$ and $Ar_g$ each independently represent an arylene group or a divalent heterocyclic group; $Ar_{10}$, $Ar_{11}$ and $Ar_{12}$ each independently represent an aryl group or a monovalent heterocyclic group; $Ar_6$ to $Ar_{12}$ may have a substituent; and x and y each independently represent 0 or 1, wherein $0 \leq x+y \leq 1$.

When the compound having a benzotriazole ring structure is a polymer, the polymer generally has, not limited to, a weight-average molecular weight of preferably $3 \times 10^2$ or larger, more preferably $3 \times 10^2$ to $1 \times 10^7$, even more preferably $1 \times 10^3$ to $1 \times 10^7$, particularly preferably $1 \times 10^4$ to $1 \times 10^7$, based on polystyrene standards from the viewpoint of being capable of forming a film by solution application.

The compound having a benzotriazole ring structure can be used in a wide emission wavelength region. To that end, preferably, the compound has the lowest triplet excitation energy (hereinafter, also referred to as a "$T_1$ energy") of preferably 2.7 eV or larger, more preferably 2.9 eV or larger, even more preferably 3.0 eV or larger, still preferably 3.1 eV or larger, particularly preferably 3.2 eV or larger. Moreover, the upper limit thereof is usually 5.0 eV.

The highest occupied molecular orbital (HOMO) and lowest unoccupied molecular orbital (LUMO) energy levels of the compound having a benzotriazole ring structure are not particularly limited. The compound having a benzotriazole ring structure has an absolute value of a LUMO energy level of preferably 1.5 eV or larger, more preferably 1.7 eV or larger, even more preferably 1.9 eV or larger, still preferably 2.0 eV or larger, particularly preferably 2.1 eV or larger, most preferably 2.2 eV or larger. Moreover, the upper limit thereof is usually 4.0 eV.

In the present specification, the values of the $T_1$ energy and the LUMO energy level are values calculated by a computational chemical approach. In the present specification, the quantum chemical calculation program Gaussian 03 is used as the computational chemical approach. The structure of the ground state was optimized by an HF (Hartree-Fock) method, and the values of the $T_1$ energy and the LUMO energy level were calculated in the optimized structure using a time-dependent density functional method at a B3P86 level. In this procedure, 6-31g* was used as a basis function. When 6-31g* is unavailable as a basis function, LANL2DZ is used instead.

When the compound having a benzotriazole ring structure has a structure represented by the general formulas (6a) to (6c), values of the $T_1$ energy and the LUMO energy level of the compound can be calculated using the structure.

When the compound having a benzotriazole ring structure is a polymer that comprises one type of repeating unit which is defined as A, the compound having a benzotriazole ring structure is represented by the following formula:

wherein n represents the degree of polymerization.

In this context, values of a $T_1$ energy and a LUMO energy level are calculated for structures wherein n=1, 2 and 3, and values at n=∞ in linear approximation with the calculated values of the $T_1$ energy and the LUMO energy level as functions of (1/n) are defined as the values of the $T_1$ energy and the LUMO energy level of the polymer.

When the compound having a benzotriazole ring structure is a polymer that comprises a plurality of repeating units, a $T_1$ energy at n=∞ (wherein n represents the degree of polymerization of the repeating unit) is calculated in all the cases in the same way as above, and the lowest $T_1$ energy among them is defined as the $T_1$ energy of the polymer. A value of the LUMO energy level at n=∞ of a repeating unit that gives the lowest value of the $T_1$ energy is defined as the value of the LUMO energy level of the polymer. In the present invention, an absolute value of the "value of the LUMO energy level" is important.

When the compound having a benzotriazole ring structure comprises a benzotriazole ring structure represented by the general formula (1-1), (1-2), (1-3), (1-4), (2-1), (2-2), (2-3), (3-1), (3-2), (3-3), (3-4), (4-1) or (4-2), it is preferred that the compound should have a partial structure adjacent to the benzotriazole ring structure, the partial structure having at least two π-conjugated electrons. Moreover, the benzotriazole ring structure represented by the general formula (1-1), (1-2), (1-3), (1-4), (2-1), (2-2), (2-3), (3-1), (3-2), (3-3), (3-4), (4-1) or (4-2) and the partial structure adjacent to the benzotriazole ring structure, the partial structure having at least two π-conjugated electrons, form therebetween a dihedral angle of preferably 20° or larger, more preferably 35° or larger, even more preferably 50° or larger, still preferably 65° or larger, particularly preferably 75° or larger.

Furthermore, in the compound having a benzotriazole ring structure, all aromatic rings and heteroaromatic rings (which include the benzotriazole ring) form therebetween a dihedral angle of preferably 40° or larger, more preferably 50° or larger, even more preferably 60° or larger, particularly preferably 70° or larger. Moreover, for obtaining such a dihedral angle, it is preferred that the compound should be free from the partial structure represented by the general formula (A-3).

In this context, the dihedral angle in the present invention means an angle calculated from the optimized structure of the ground state. The dihedral angle is defined by, for example, in the benzotriazole ring structure represented by the general formula (1-1), (1-2), (1-3), (1-4), (2-1), (2-2), (2-3), (3-1), (3-2), (3-3), (3-4), (4-1) or (4-2), an atom $(a_1)$ at the position of the bond and an atom $(a_2)$ adjacent thereto, and by, in the structure bonded to the benzotriazole ring structure, an atom ($a_3$) at the position of the bond and an atom ($a_4$) adjacent thereto. In this context, when a plurality of atoms ($a_2$) or ($a_4$) can be selected, a dihedral angle is calculated in all the cases, and the lowest value among all absolute values is defined as the dihedral angle. The atom ($a_3$) is an atom with a π-conjugated electron, and the atom ($a_4$) may be an atom with or without a π-conjugated electron and is preferably an atom with a π-conjugated electron, more preferably a carbon atom, a nitrogen atom, a silicon atom or a phosphorus atom. In the present specification, when the compound having a benzotriazole ring structure is a polymer, it is calculated from the optimized structure of the ground state of a structure wherein n=3 (n is the degree of polymerization) determined by the computational chemical approach (i.e., a structure with the lowest heat of formation). For the rest, it is calculated from the optimized structure of the ground state of the compound structure itself. When the compound having a benzotriazole ring structure has a plurality of the benzotriazole ring structures, it also has a plurality of the dihedral angles. In this case, it is preferred that all the dihedral angles in the compound should satisfy the conditions described above.

Moreover, in the compound having a benzotriazole ring structure, the dihedral angles formed by all aromatic rings and heteroaromatic rings (which include the benzotriazole ring) can also be defined in the same way as above using four atoms including atoms at the position of the bond.

When the compound having a benzotriazole ring structure is a compound represented by the general formulas (6a) to (6c), it is represented by, for example, the formulas (6-1) to (6-30) shown below.

In the formulas (6-1) to (6-30) shown below and the formulas (7-1) to (7-23) described later, R* represents a hydrogen atom or a monovalent substituent. The monovalent substituent represented by R* is exemplified by a halogen atom, an alkyl group, an alkoxy group, an alkylthio group, an aryl group which may have a substituent, an aryloxy group, an arylthio group, an arylalkyl group, an arylalkyloxy group, an arylalkylthio group, an acyl group, an acyloxy group, an amide group, an acid imide group, an imine residue, a substituted amino group, a substituted silyl group, a substituted silyloxy group, a substituted silylthio group, a substituted silylamino group, a monovalent heterocyclic group which may have a substituent, a heteroaryl group which may have a substituent, a heteroaryloxy group, a heteroarylthio group, an arylalkenyl group, an arylethynyl group, a substituted carboxyl group and a cyano group. A plurality of R* may be the same or different. R* is more preferably an alkyl group, an alkoxy group, an aryl group which may have a substituent or a heteroaryl group which may have a substituent. A plurality of R* may be the same or different.

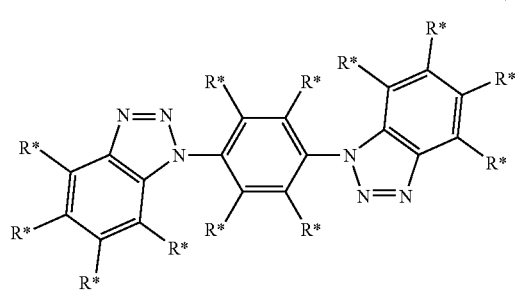

(6-1)

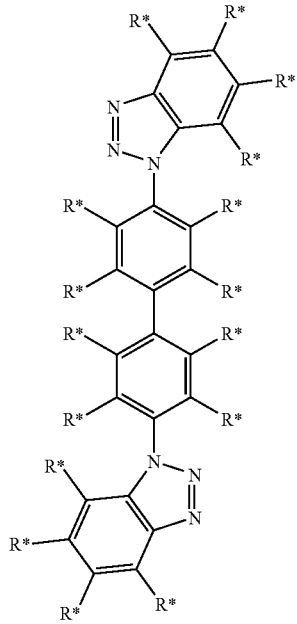

(6-2)

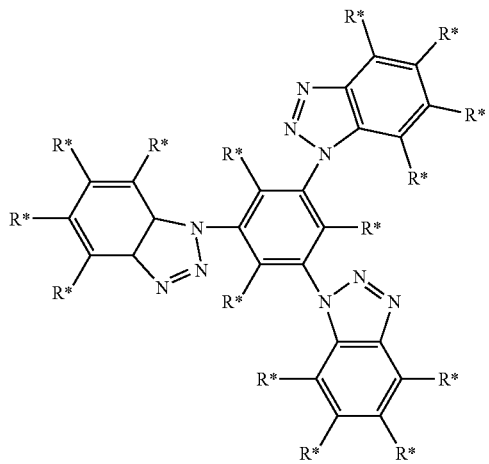

(6-3)

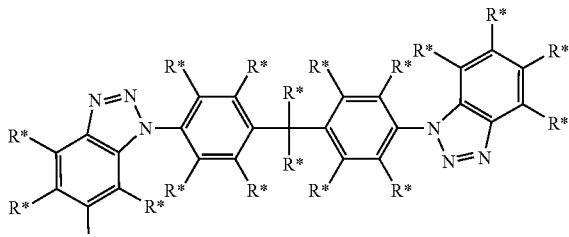

(6-4)

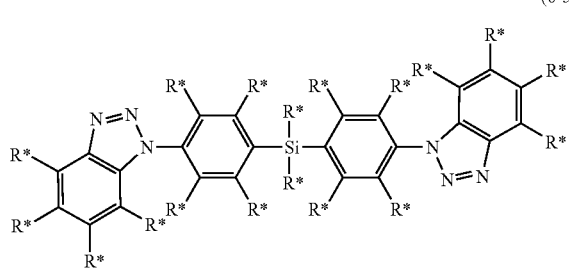

(6-5)

(6-6)
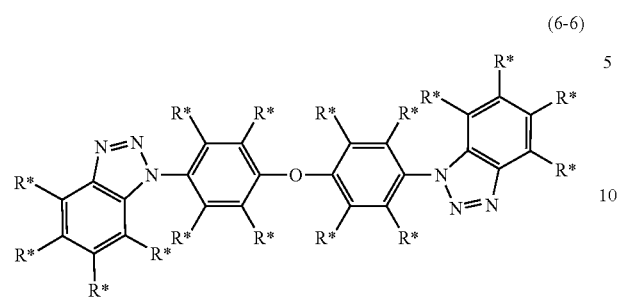
(6-7)
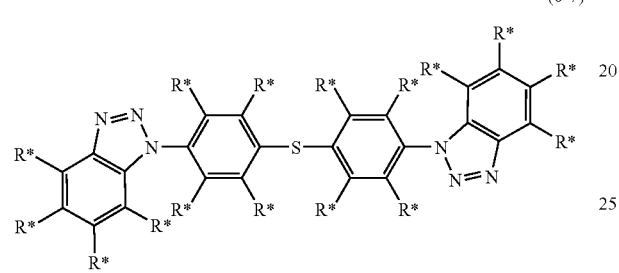
(6-8)
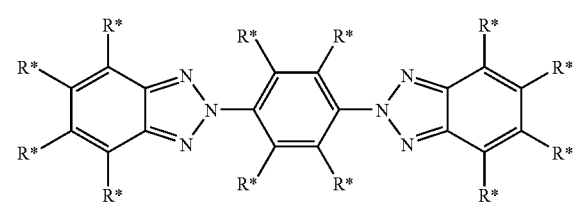
(6-9)
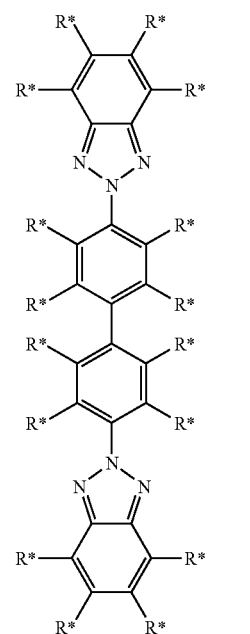
(6-10)
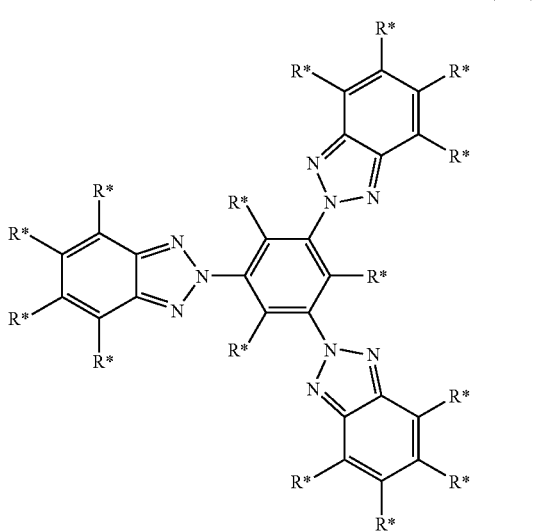
(6-11)
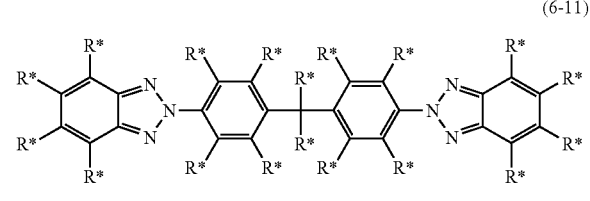
(6-12)
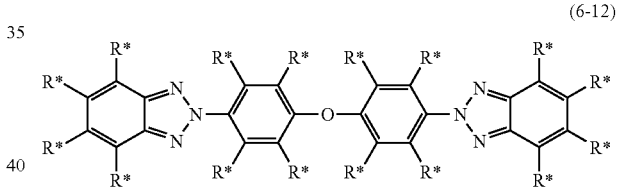
(6-13)
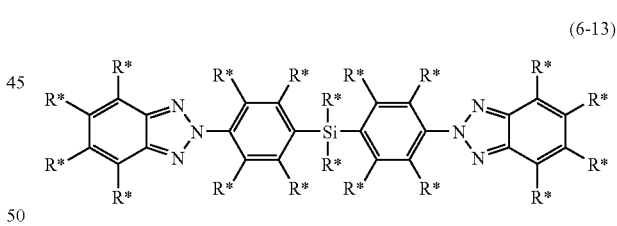
(6-14)
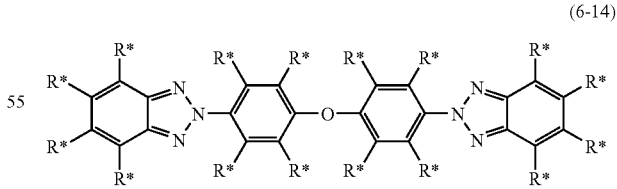
(6-15)
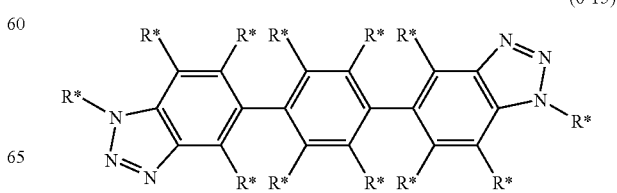

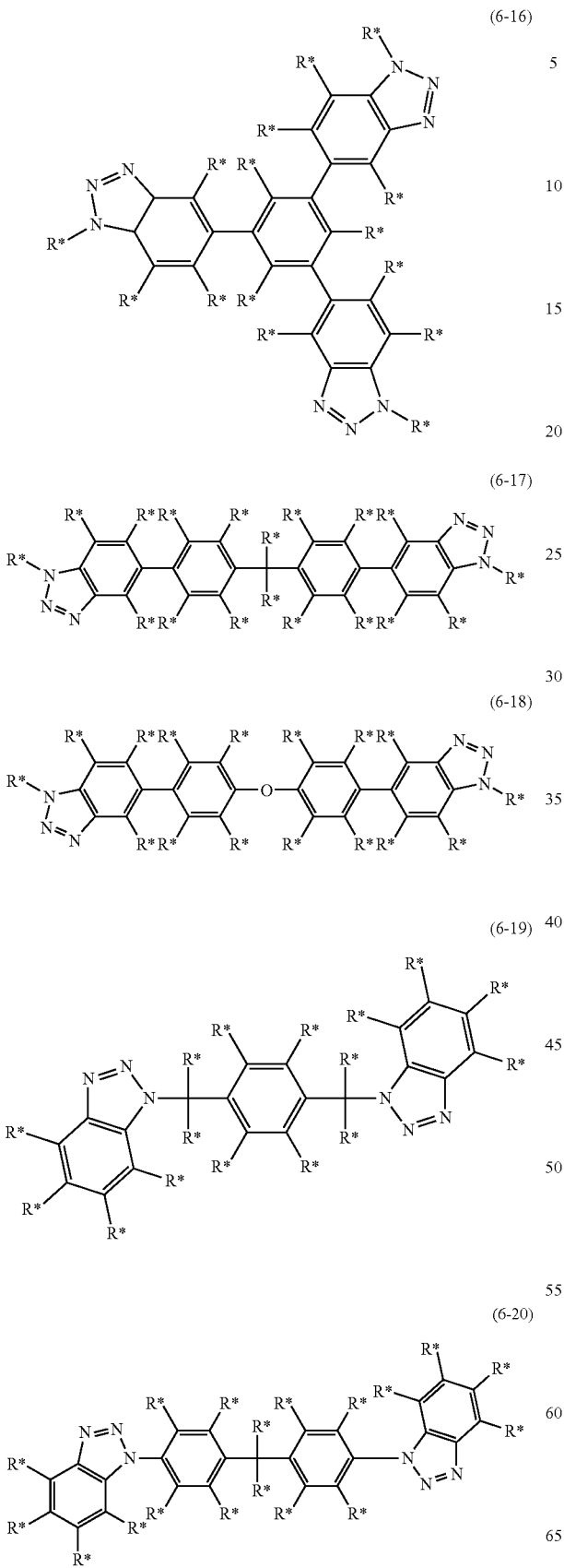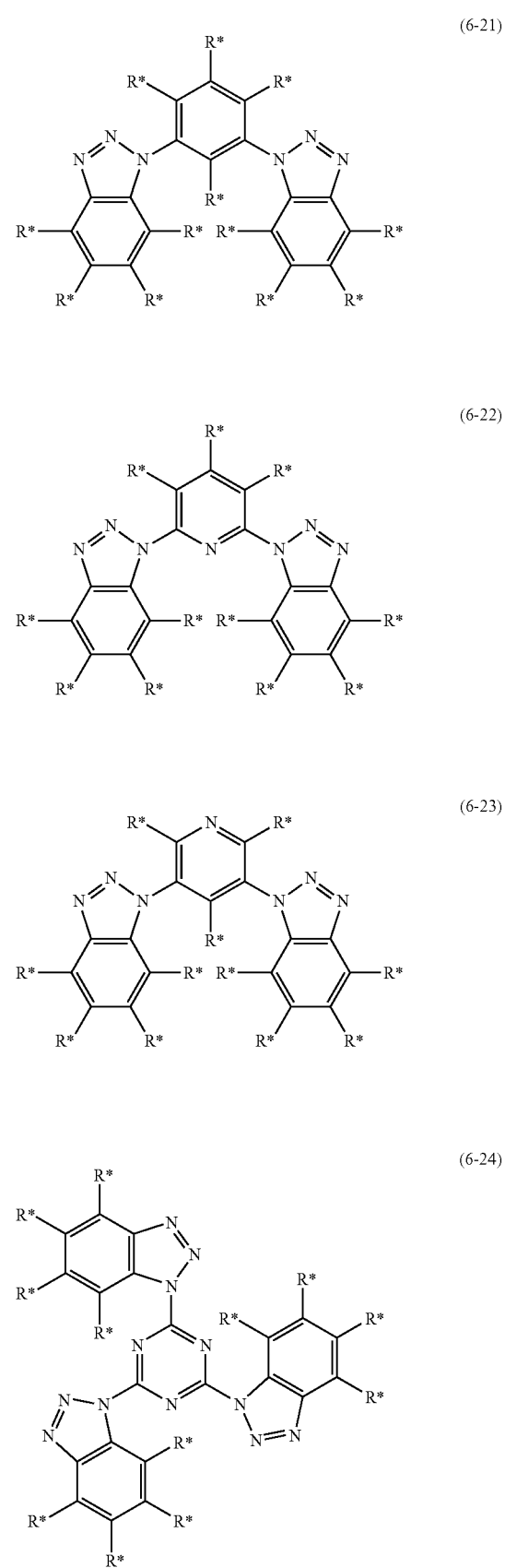

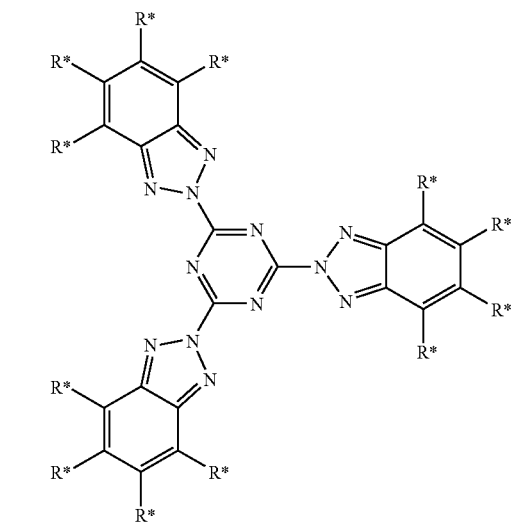
(6-25)

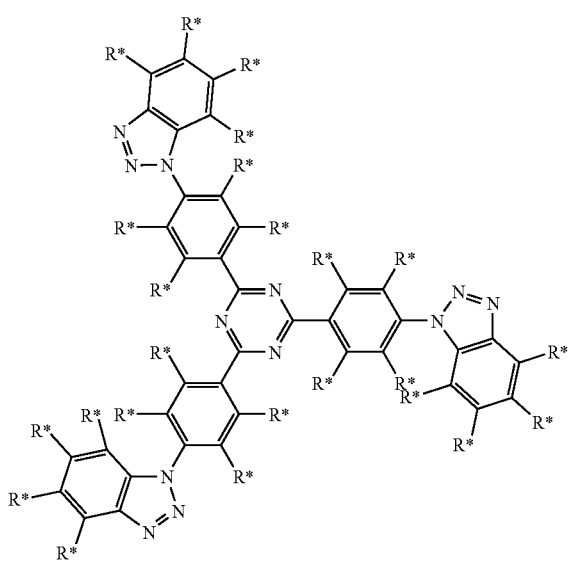
(6-26)

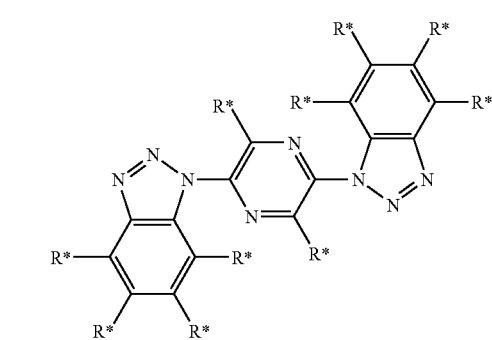
(6-27)

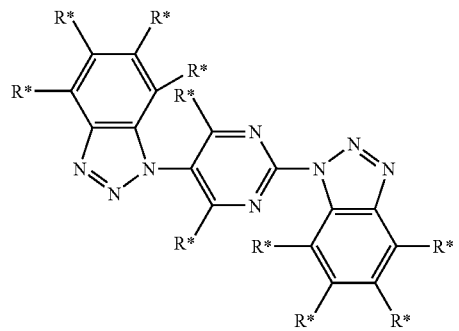
(6-28)

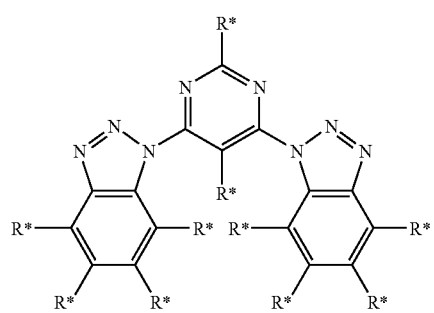
(6-29)

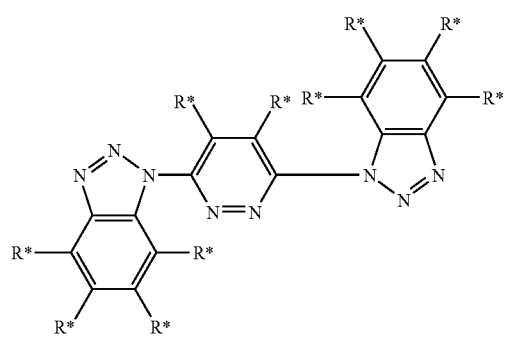
(6-30)

When the compound having a benzotriazole ring structure is a polymer, it is preferred that the benzotriazole ring structure should be a repeating unit. Examples thereof include a polymer whose repeating unit is represented by the general formula (1-1), (1-2), (1-3), (1-4), (2-1), (2-2), (2-3), (3-1), (3-2), (3-3), (3-4), (4-1) or (4-2) and a polymer containing, in addition to these benzotriazole ring structures, a structure selected from an aromatic ring and/or a heteroatom-containing five or more membered heterocyclic ring, aromatic amine and a structure represented by the general formula (5) and specifically include those represented by the following formulas (7-1) to (7-23):

(7-1)

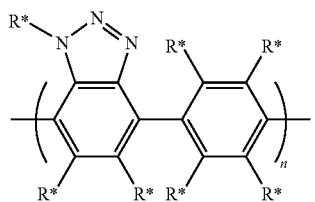
(7-2)
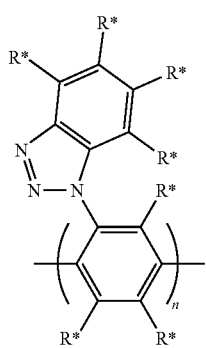
(7-3)
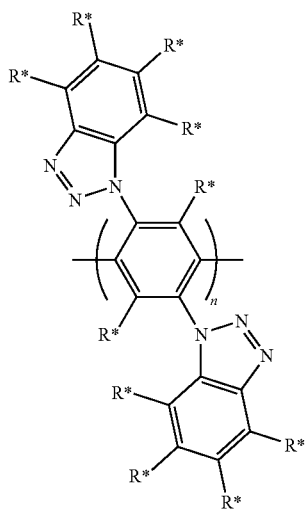
(7-4)
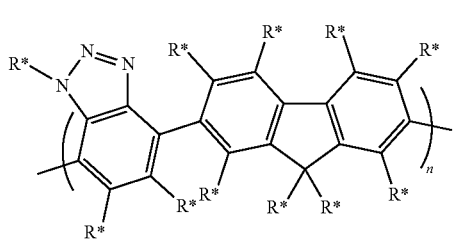
(7-5)
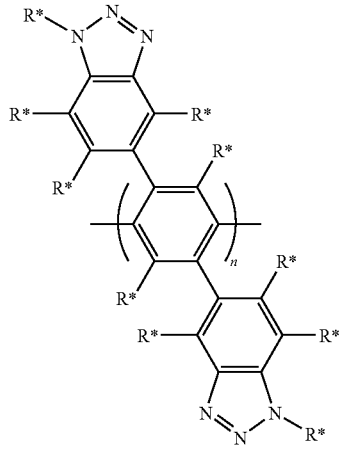
(7-6)
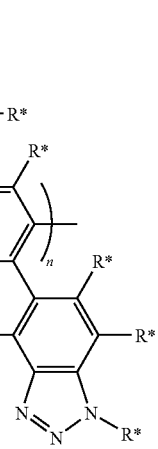
(7-7)
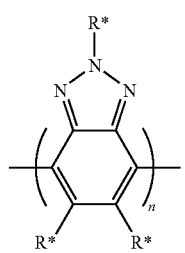
(7-8)
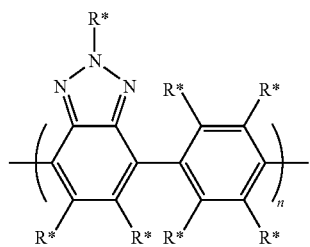
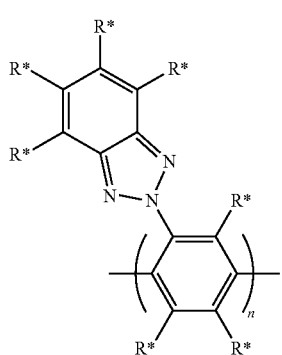
(7-9)

(7-10)
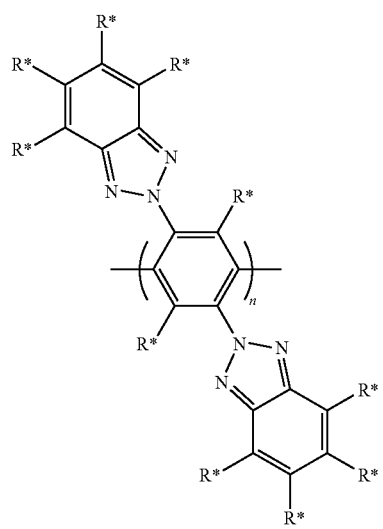
(7-11)
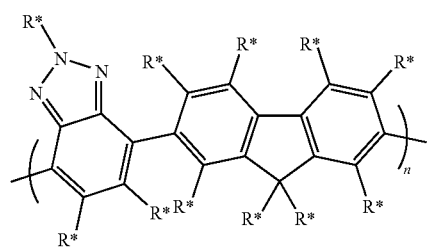
(7-12)
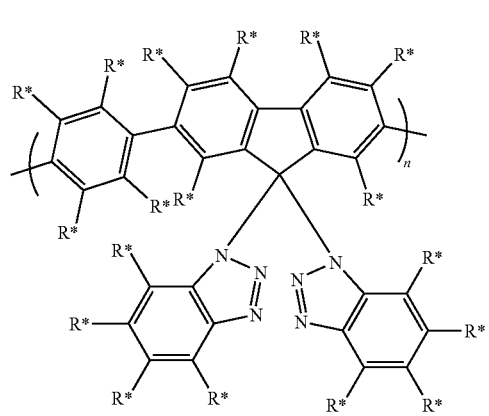
(7-13)
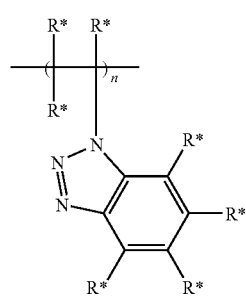
(7-14)
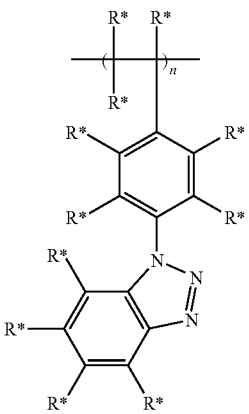
(7-15)
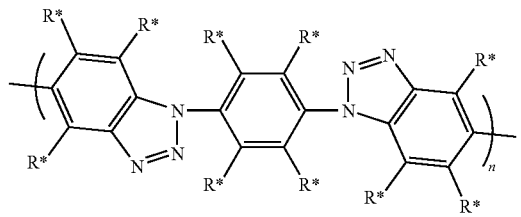
(7-16)
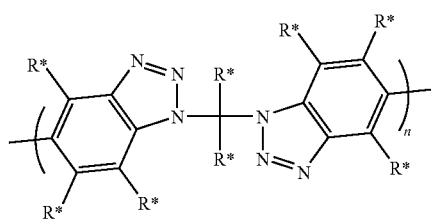
(7-17)
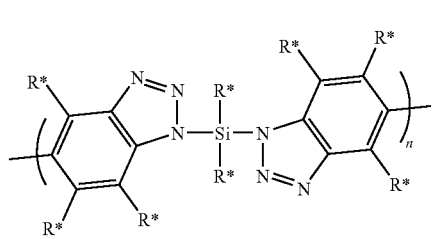
(7-18)
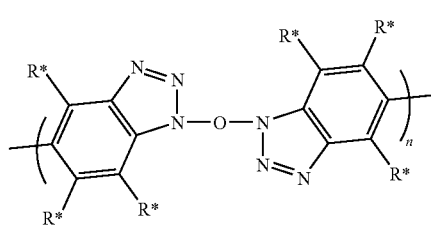

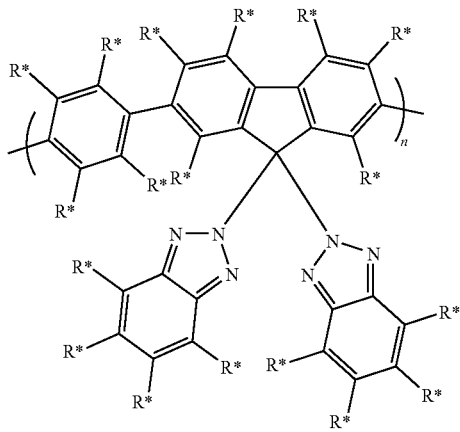 (7-19)
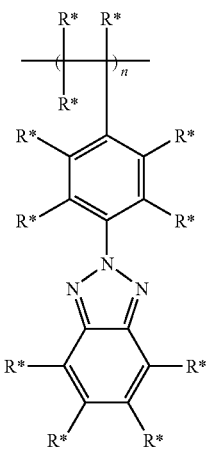 (7-21)
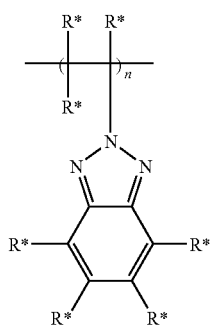 (7-20)
(7-22)
(7-23)
wherein n represents the degree of polymerization.
Moreover, examples of the specific structure of the compound having a benzotriazole ring structure include the followings:
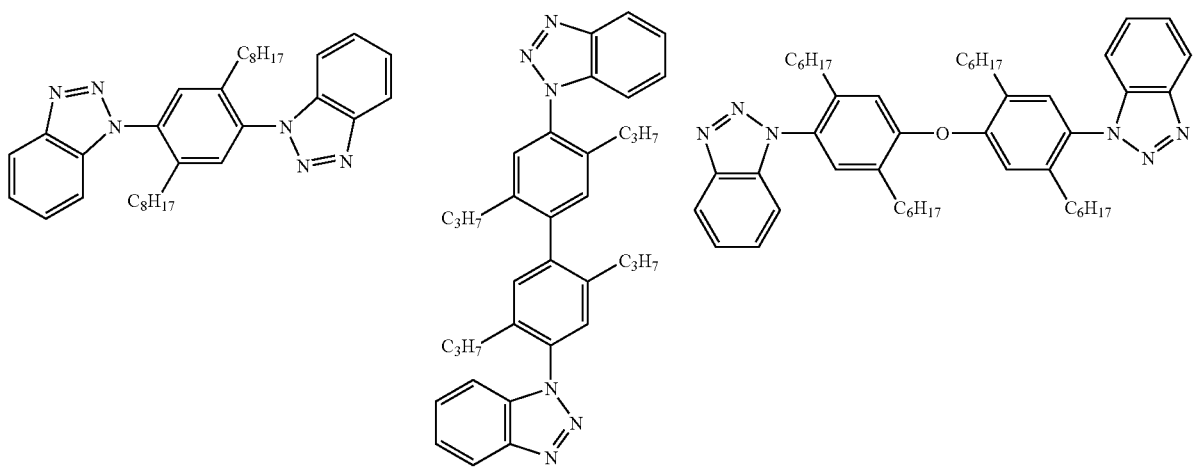

-continued
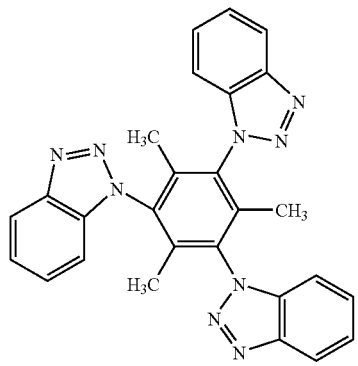
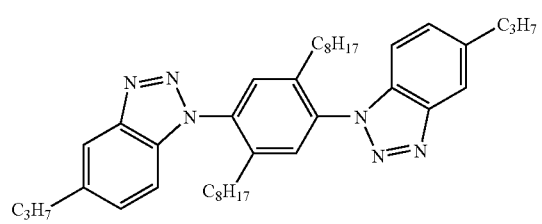
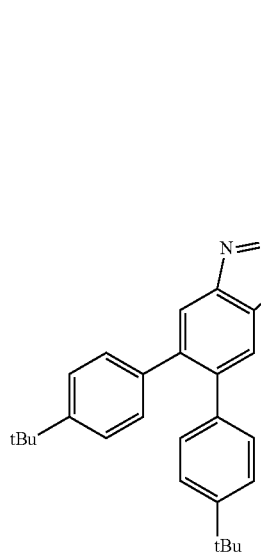
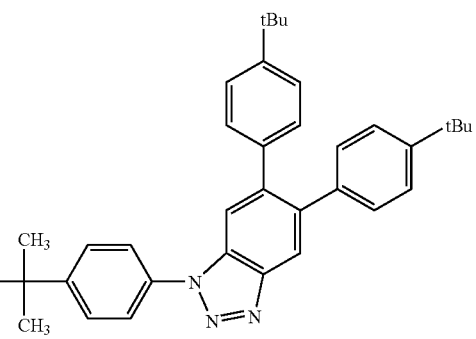
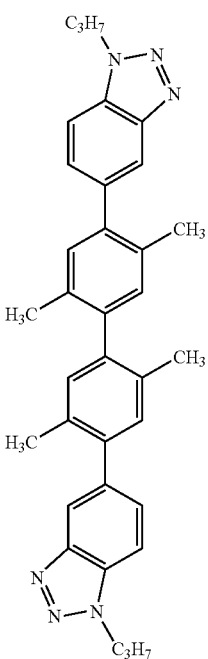
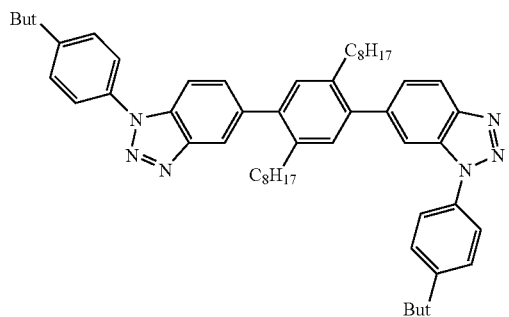
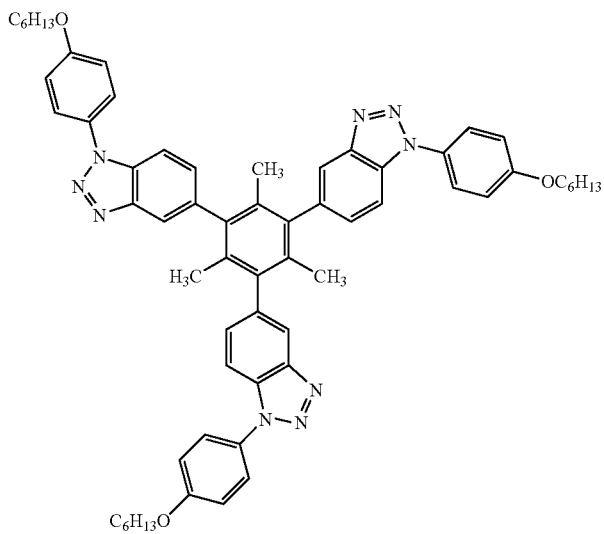

-continued
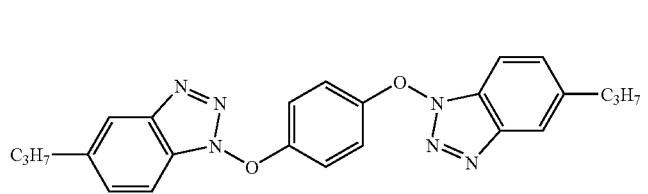
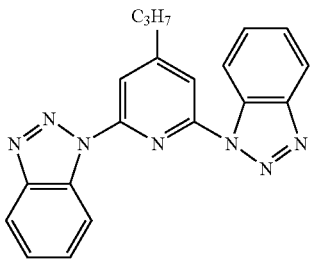
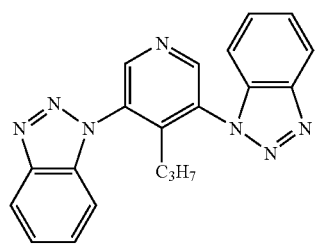
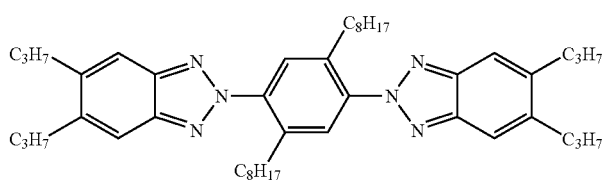
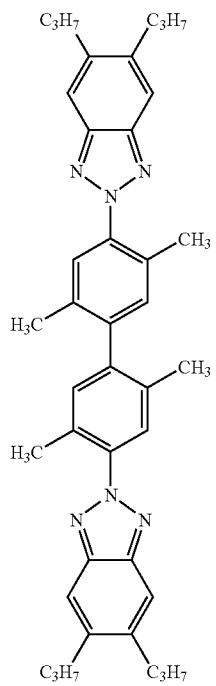
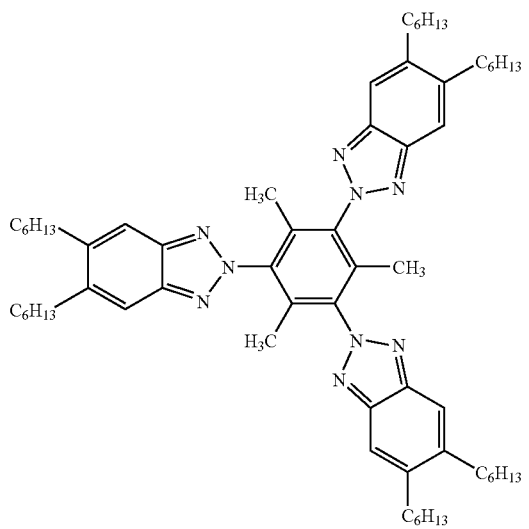
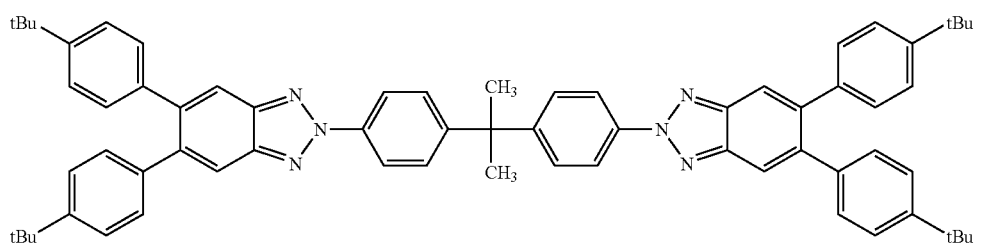

29
-continued
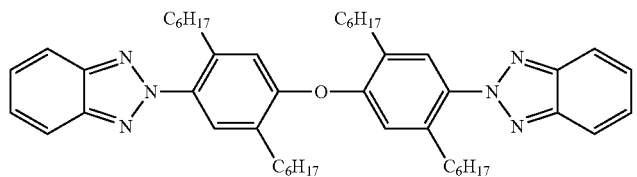
30
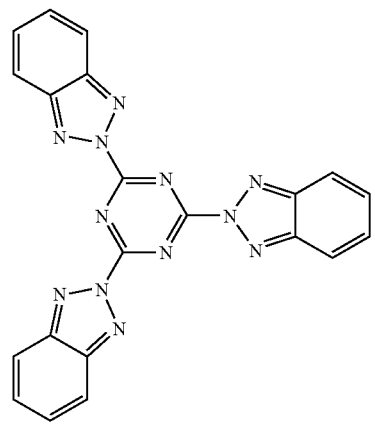
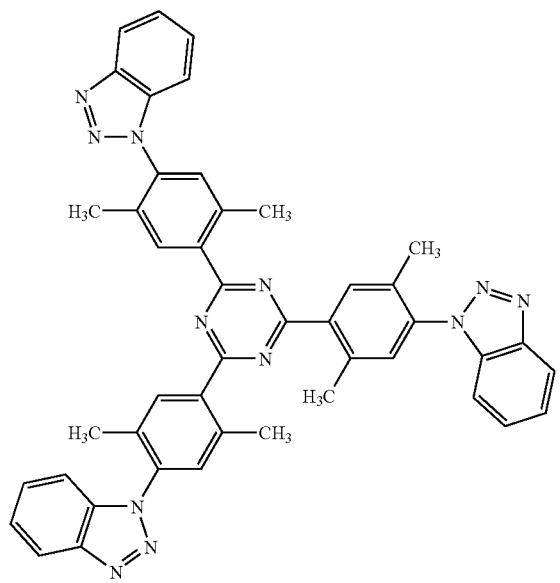
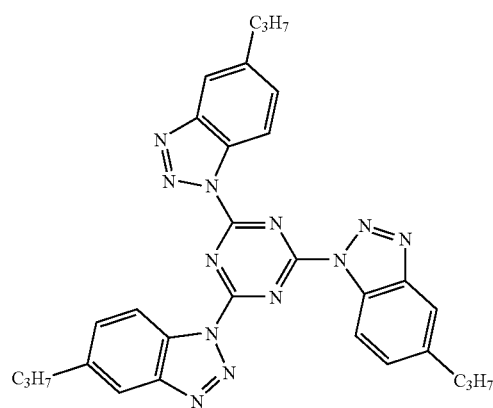
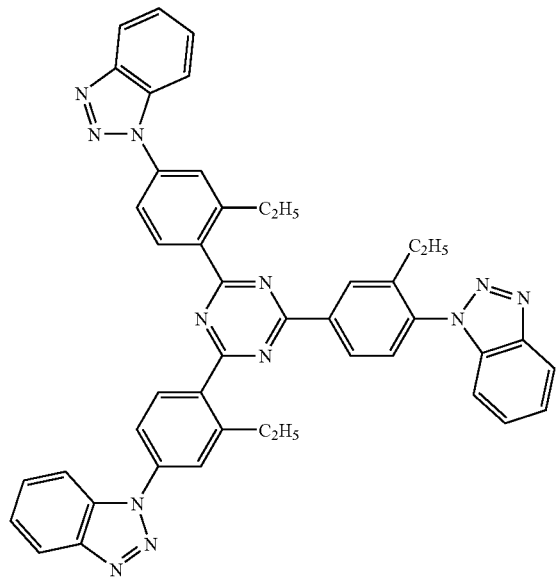
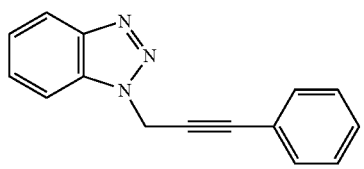

31
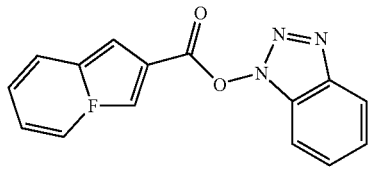
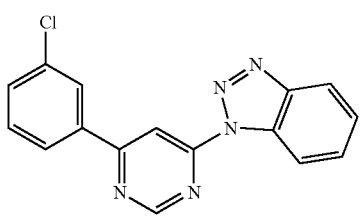
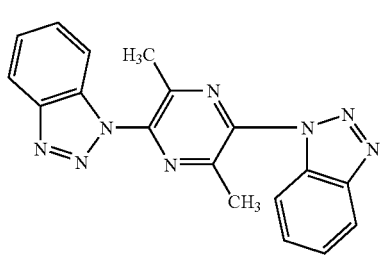
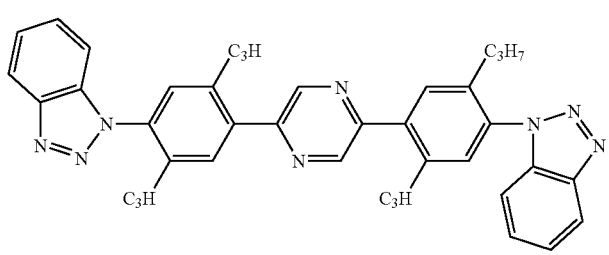
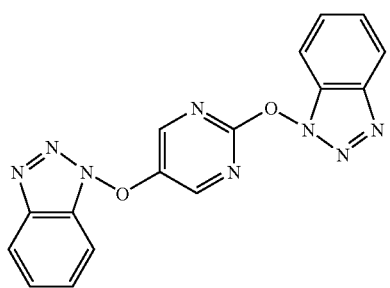
32
-continued
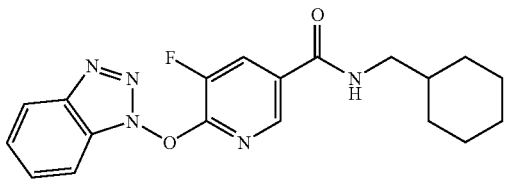
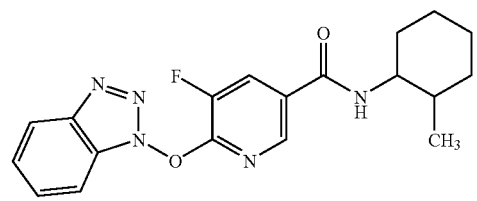
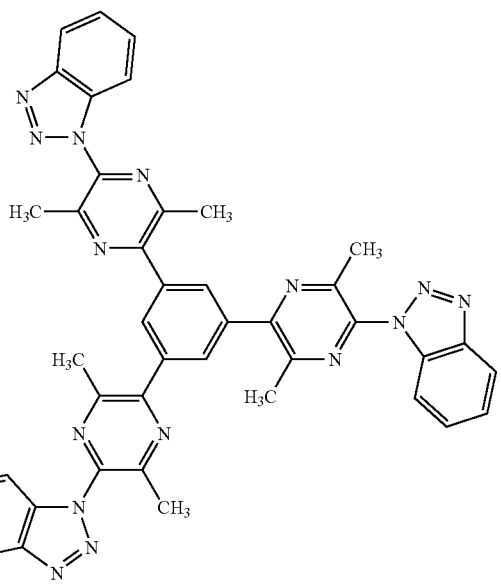
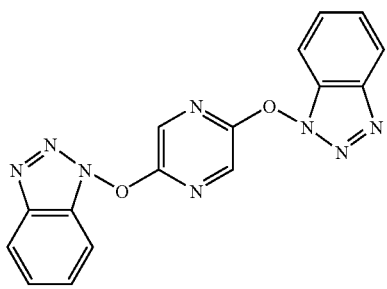
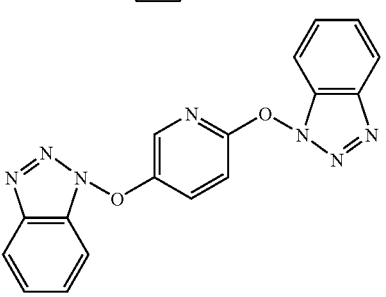

-continued
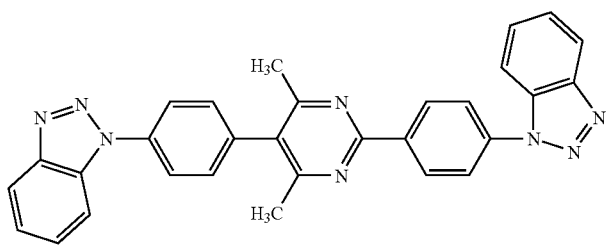
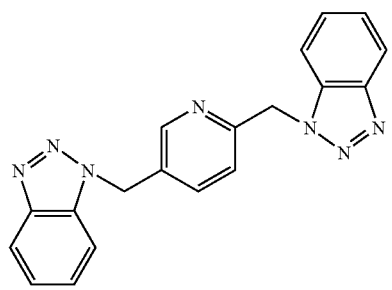
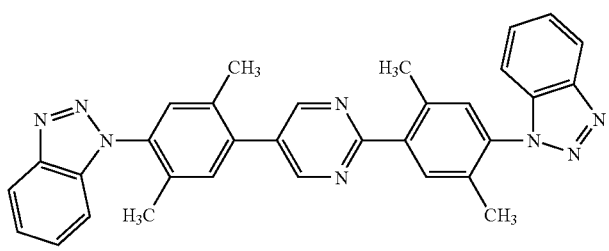
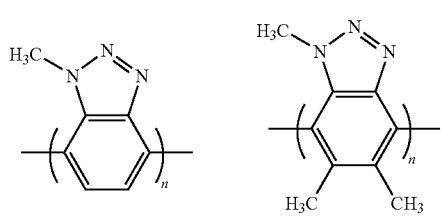
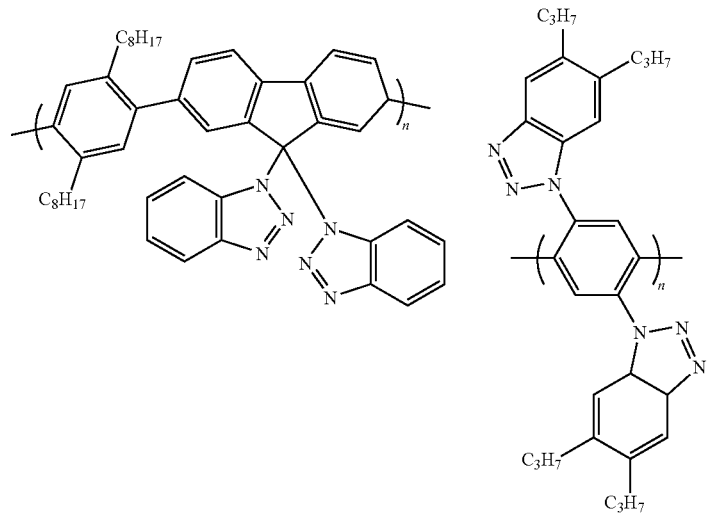
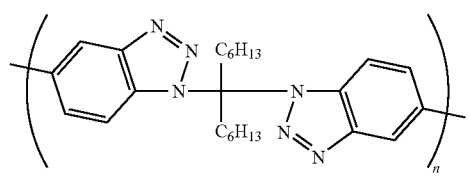
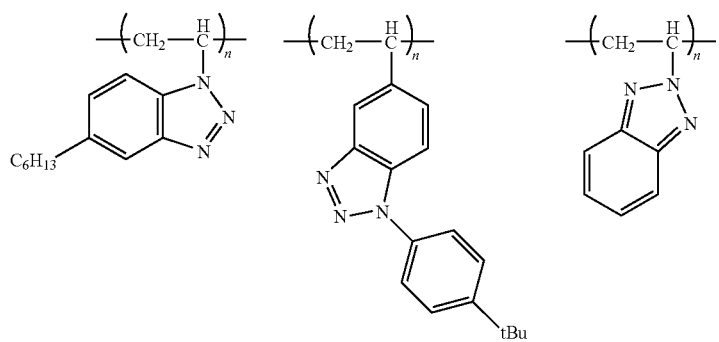
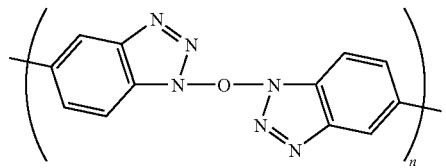

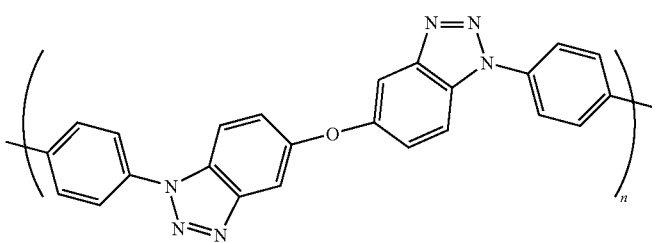
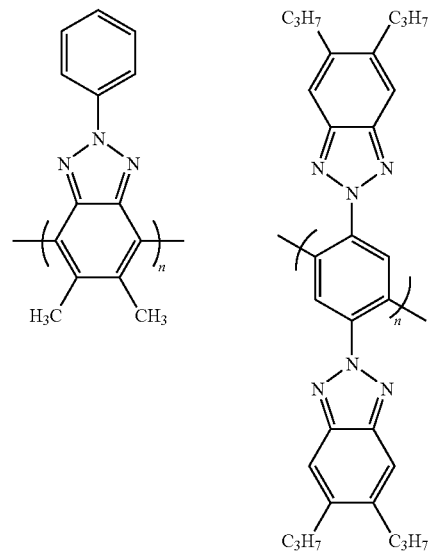
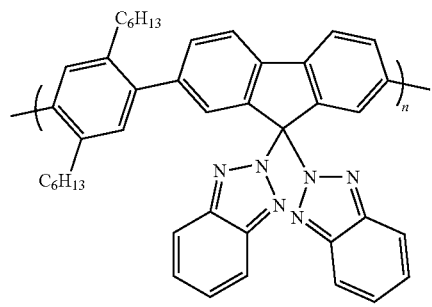
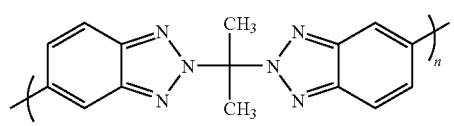

wherein n represents the degree of polymerization; and tBu represents a tert-butyl group.

Compounds known in the art such as triplet light-emitting complexes can be used as the phosphorescence-emitting compound. Examples thereof include those previously used as low-molecular EL-emitting materials. The are disclosed in, for example, Nature, (1998), 395, 151; Appl. Phys. Lett. (1999), 75 (1), 4; Proc. SPIE-Int. Soc. Opt. Eng. (2001), 4105 (Organic Light-Emitting Materials and Devices IV), 119; J. Am. Chem. Soc., (2001), 123, 4304; Appl. Phys. Lett., (1997), 71 (18), 2596; Syn. Met., (1998), 94 (1), 103; Syn. Met., (1999), 99 (2), 1361; Adv. Mater., (1999), 11 (10), 852; Inorg. Chem., (2003), 42, 8609; Inorg. Chem., (2004), 43, 6513; Journal of the SID 11/1, 161 (2003); WO2002/066552; WO2004/020504; WO2004/020448, etc. It is particularly preferred from the viewpoint of obtaining high efficiency that in the highest occupied molecular orbital (HOMO) of a metal complex, the sum of the square of orbital coefficients of outermost d orbitals of the central metal should occupy ⅓ or larger of the sum of the square of all the atomic orbital coefficients. Examples thereof include ortho-metalated complexes having a transition metal belonging to the 6th period as a central metal.

The central metal in the triplet light-emitting complexes is usually an atom with an atomic number of 50 or higher and is a metal that is capable of causing spin-orbit interaction in the complex and causing intersystem crossing between singlet and triplet states. The central metal is preferably a gold, platinum, iridium, osmium, rhenium, tungsten, europium, terbium, thulium, dysprosium, samarium, praseodymium, gadolinium or ytterbium atom, more preferably a gold, platinum, iridium, osmium, rhenium or tungsten atom, even more preferably a gold, platinum, iridium, osmium or rhenium atom, still more preferably a gold, platinum, iridium or rhenium atom, particularly preferably a platinum or iridium atom.

Examples of a ligand in the triplet light-emitting complex include 8-quinolinol and derivatives thereof, benzoquinolinol and derivatives thereof and 2-phenyl-pyridine and derivatives thereof.

The phosphorescence-emitting compound is preferably a compound having a substituent such as an alkyl group, an alkoxy group, an aryl group which may have a substituent or a heteroaryl group which may have a substituent from the viewpoint of solubility in an organic solvent. Furthermore, the substituent has a total of preferably three or more atoms, more preferably five or more atoms, even more preferably seven or more atoms, particularly preferably ten or more atoms, exclusive of hydrogen atoms. Moreover, it is preferred that at least one substituent should be present in each ligand. The types of the substituents may be the same or different in each ligand.

Examples of the phosphorescence-emitting compound include the followings:

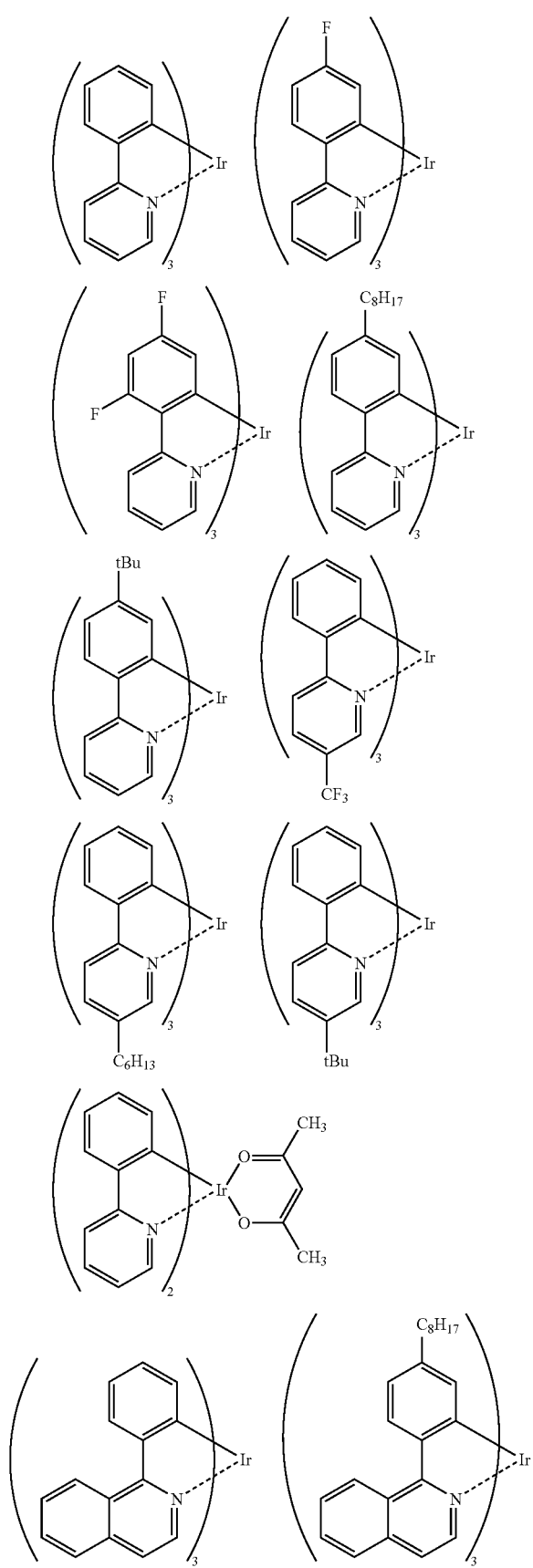
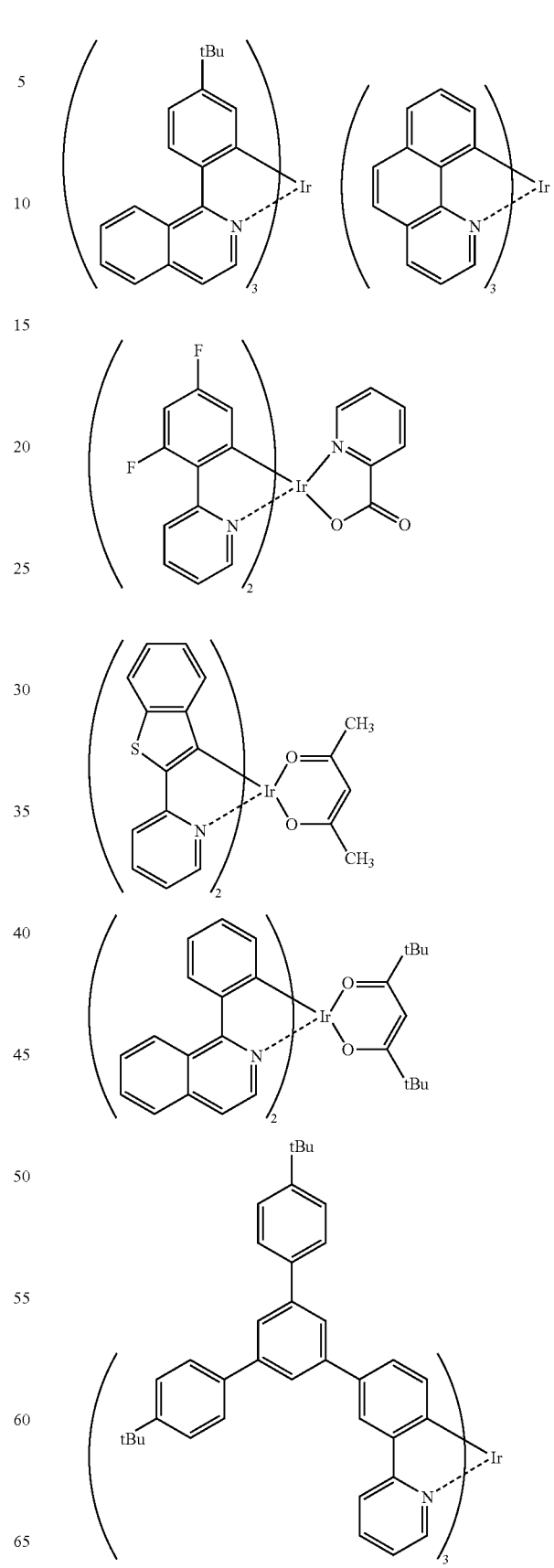

-continued

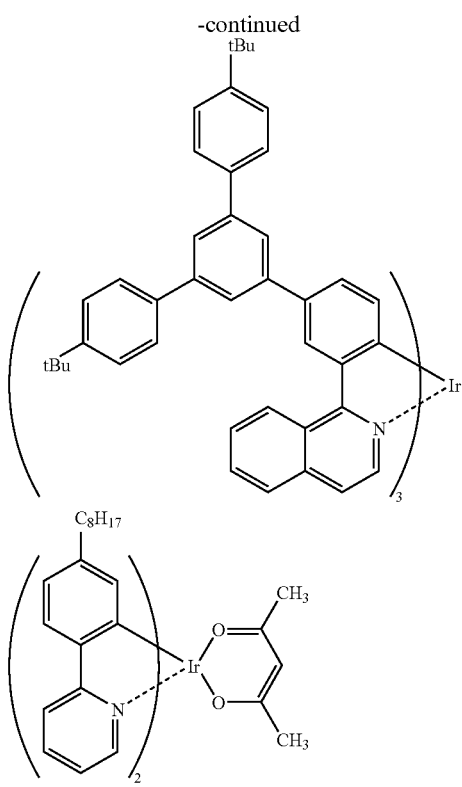

The amount of the phosphorescence-emitting compound in the composition of the present invention differs depending on the type of an organic compound combined therewith and a property to be optimized and therefore, is not particularly limited. The amount is usually 0.01 to 80 parts by weight, preferably 0.1 to 30 parts by weight, more preferably 0.1 to 15 parts by weight, particularly preferably 0.1 to 10 parts by weight, with respect to 100 parts by weight of the compound having a benzotriazole ring structure. In this context, in the composition of the present invention, the compound having a benzotriazole ring structure and the phosphorescence-emitting compound are respectively used alone or in combination of two or more thereof.

The composition of the present invention may comprise an optional component other than the compound having a benzotriazole ring structure and the phosphorescence-emitting compound without impairing the object of the present invention. Examples of this optional component include a hole transport material, an electron transport material and an antioxidant.

Examples of the hole transport material include aromatic amine, carbazole derivatives and polyparaphenylene derivatives previously known in the art as hole transport materials for organic EL devices.

Examples of the electron transport material include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives or metal complexes of 8-hydroxyquinoline or derivatives thereof previously known in the art as electron transport materials for organic EL devices.

In the composition of the present invention, it is preferred from the viewpoint of high luminous efficiency that the lowest triplet excitation energy (ETP) of the compound having a benzotriazole ring structure should satisfy, with a lowest triplet excitation energy (ETT) of the phosphorescence-emitting compound, the following formula:

$TT > ETP - 0.5$ (eV), more preferably $TT > ETP - 0.3$ (eV), even more preferably $TT > ETP - 0.2$ (eV).

Furthermore, it is preferred that ETP should be equal to or larger than ETT.

A light-emitting thin film of the present invention is obtained by forming a thin film using the composition, etc., of the present invention. Methods known in the art can be selected appropriately and used as the method for forming a thin film. Examples of the method include solution application, deposition and transfer. The solution application can be performed by application methods such as spin coating, casting, micro-gravure coating, gravure coating, bar coating, roll coating, wire bar coating, dip coating, spray coating, screen printing, flexographic printing, offset printing and inkjet methods.

A solvent that can dissolve or uniformly disperse the composition therein is preferable. The solvent is exemplified by chlorine solvents (chloroform, methylene chloride, 1,2-dichloroethane, 1,1,2-trichloroethane, chlorobenzene, o-dichlorobenzene, etc.), ether solvents (tetrahydrofuran, dioxane, etc.), aromatic hydrocarbon solvents (toluene, xylene, etc.), aliphatic hydrocarbon solvents (cyclohexane, methylcyclohexane, n-pentane, n-hexane, n-heptane, n-octane, n-nonane, n-decane, etc.), ketone solvents (acetone, methyl ethyl ketone, cyclohexanone, etc.), ester solvents (ethyl acetate, butyl acetate, ethyl cellosolve acetate, etc.), polyhydric alcohols and derivatives thereof (ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol, etc.), alcoholic solvents (methanol, ethanol, propanol, isopropanol, cyclohexanol, etc.), sulfoxide solvents (dimethyl sulfoxide, etc.) and amide solvents (N-methyl-2-pyrrolidone, N,N-dimethylformamide, etc.). The solvent can be selected from among them and used. Moreover, these organic solvents may be used alone or in combination of two or more thereof.

When an inkjet method is used, methods known in the art for selecting a solvent in the solution or additives can be used for improving discharge from a head, nonuniformity, and so on. In this case, it is preferred that the solution should have a viscosity of 1 to 100 mPa·s at 25° C. Moreover, excessive vaporization tends to make repetitive discharge from a head difficult. From these points of view, examples of preferable solvents used include single or mixed solvents containing anisole, bicyclohexyl, xylene, tetralin and dodecylbenzene. In general, a solution for inkjet suitable for the composition used can be obtained by a method comprising mixing a plurality of solvents, a method comprising adjusting a concentration in the solution of the composition, and so on.

<Polymer>

A polymer of the present invention has a residue of a phosphorescence-emitting compound and a benzotriazole ring structure. The phosphorescence-emitting compound and the benzotriazole ring structure are the same as those described and exemplified in the paragraph of the composition. Specific examples of the polymer of the present invention include (1) a polymer having the structure of the phosphorescence-emitting compound in the main chain, (2) a polymer having the structure of the phosphorescence-emitting compound in the end, and (3) a polymer having the structure of the phosphorescence-emitting compound in the side chain.

<Light-emitting Device>

Next, a light-emitting device of the present invention will be described.

The light-emitting device of the present invention is obtained using the composition, etc., of the present invention. The light-emitting device usually comprises the composition or the polymer of the present invention at least at a certain site between electrodes comprising an anode and a cathode and, preferably, comprises them in the form of the light-emitting thin film as a light-emitting layer. Moreover, the light-emitting device may comprise one or more of layers known in the art which have other functions from the viewpoint of improving performance such as luminous efficiency and durability. Examples of such layers include a charge transport layer (i.e., a hole transport layer and an electron transport layer), a charge block layer (i.e., a hole block layer and an electron block layer), a charge injection layer (i.e., a hole injection layer and an electron injection layer) and a buffer layer. In this context, in the light-emitting device of the present invention, the light-emitting layer, the charge transport layer, the charge block layer, the charge injection layer, the buffer layer, and the like may respectively be single-layered or double- or more layered.

The light-emitting layer is a layer having the function of emitting light. The hole transport layer is a layer having the function of transporting holes. The electron transport layer is a layer having the function of transporting electrons. These electron transport and hole transport layers are collectively referred to as a charge transport layer. Moreover, the charge block layer is a layer having the function of trapping holes or electrons into the light-emitting layer and is classified into a hole block layer which is a layer for transporting electrons and trapping holes and into an electron block layer which is a layer for transporting holes and trapping electrons.

Examples of the buffer layer include a layer which is located adjacently to the anode and comprises a conductive polymer.

Specific examples of the light-emitting device of the present invention include the following structures a) to q):
a) anode/light-emitting layer/cathode;
b) anode/hole transport layer/light-emitting layer/cathode;
c) anode/light-emitting layer/electron transport layer/cathode;
d) anode/light-emitting layer/hole block layer/cathode;
e) anode/hole transport layer/light-emitting layer/electron transport layer/cathode;
f) anode/charge injection layer/light-emitting layer/cathode;
g) anode/light-emitting layer/charge injection layer/cathode;
h) anode/charge injection layer/light-emitting layer/charge injection layer/cathode;
i) anode/charge injection layer/hole transport layer/light-emitting layer/cathode;
j) anode/hole transport layer/light-emitting layer/charge injection layer/cathode;
k) anode/charge injection layer/hole transport layer/light-emitting layer/charge injection layer/cathode;
l) anode/charge injection layer/light-emitting layer/electron transport layer/cathode;
m) anode/light-emitting layer/electron transport layer/charge injection layer/cathode;
n) anode/charge injection layer/light-emitting layer/electron transport layer/charge injection layer/cathode;
o) anode/charge injection layer/hole transport layer/light-emitting layer/electron transport lager/cathode;
p) anode/hole transport layer/light-emitting layer/electron transport layer/charge injection layer/cathode; and
q) anode/charge injection layer/hole transport layer/light-emitting layer/electron transport layer/charge injection layer/cathode.

In this context, the symbol/represents that the layers described before and after the symbol are stacked adjacently to each other. The same holds true for description below. In this context, the light-emitting layer, the hole transport layer and the electron transport layer may each independently be double- or more layered for use.

When the light-emitting device of the present invention has a hole transport layer (usually, the hole transport layer contains a hole transport material), materials known in the art can be selected appropriately and used as the hole transport material. Such materials known in the art include polymer hole transport materials such as polyvinylcarbazole and derivatives thereof, polysilane and derivatives thereof, polysiloxane derivatives having aromatic amine in the side chain or the main chain, pyrazoline derivatives, arylamine derivatives, stilbene derivatives, triphenyldiamine derivatives, polyaniline and derivatives thereof, polythiophene and derivatives thereof, polypyrrole and derivatives thereof, poly(p-phenylene vinylene) and derivatives thereof, poly(2,5-thienylene vinylene) and derivatives thereof. Furthermore, the materials described in JP-A-63-70257, JP-A-63-175860, JP-A-2-135359, JP-A-2-135361, JP-A-2-209988, JP-A-3-37992 and JP-A-3-152184 are also included.

When the light-emitting device of the present invention has an electron transport layer (usually, the electron transport layer contains an electron transport material), materials known in the art can be selected appropriately and used as the electron transport material. Such materials known in the art include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof.

The film thicknesses of the hole transport layer and the electron transport layer differ in optimum value depending on materials used and need only to be selected to offer appropriate values of a drive voltage and luminous efficiency. These layers require at least a thickness that prevents pinhole formation. Too thick a film thickness is not preferable, because a high drive voltage for the device is required. Thus, the hole transport layer and the electron transport layer have a film thickness of, for example, 1 nm to 1 µm, preferably 2 nm to 500 nm, more preferably 5 nm to 200 nm.

Moreover, of the charge transport layers disposed adjacently to the electrode, those having the function of improving charge injection efficiency from the electrode and the effect of decreasing a drive voltage for the device may particularly be called a charge injection layer (i.e., a general term for a hole injection layer and an electron injection layer; the same holds true for description below).

Furthermore, the charge injection layer or an insulating layer (usually, 0.5 nm to 4 nm in average film thickness; the same holds true for description below) may be disposed adjacently to the electrode for improving adhesion to the electrode and charge injection from the electrode. Moreover, a thin buffer layer may be inserted in the interface of the charge transport layer or the light-emitting layer for, for example, improving adhesion of the interface or preventing contamination.

The order in which layers are stacked, the number of layers, and the thickness of each layer can be selected appropriately in consideration of luminous efficiency and a device lifetime.

Examples of the charge injection layer include: a layer comprising a conductive polymer; a layer which is disposed between the anode and the hole transport layer and comprises a material having an ionization potential intermediate between the corresponding values of the anode material and the hole transport material contained in the hole transport layer; and a layer which is disposed between the cathode and the electron transport layer and comprises a material having electron affinity intermediate between the corresponding values of the cathode material and the electron transport material contained in the electron transport layer.

The material used in the charge injection layer needs only to be selected appropriately according to the relationship with the materials for the electrode or the adjacent layer and is exemplified by polyaniline and derivatives thereof, polythiophene and derivatives thereof, polypyrrole and derivatives thereof, polyphenylene vinylene and derivatives thereof, polythienylene vinylene and derivatives thereof, polyquinoline and derivatives thereof, polyquinoxaline and derivatives thereof, conductive polymers (e.g., polymers containing an aromatic amine structure in the main chain or the side chain), metallophthalocyanine (e.g., copper phthalocyanine) and carbon.

The insulating layer has the function of facilitating charge injection. Examples of materials for the insulating layer include metal fluorides, metal oxides and organic insulating materials. Examples of the light-emitting device comprising the insulating layer include: a light-emitting device comprising the insulating layer disposed adjacently to the cathode; and a light-emitting device comprising the insulating layer disposed adjacently to the anode.

The light-emitting device of the present invention is usually formed on a substrate. The substrate is any of those not changing when the electrode and subsequently the organic layer are formed thereon. Examples thereof include glass, plastic, polymer films and silicon substrates. When an opaque substrate is used, it is preferred that the electrode on the other side should be transparent or semitransparent.

At least one of the anode and the cathode contained in the light-emitting device of the present invention is usually transparent or semitransparent. Particularly, it is preferred that the anode should be transparent or semitransparent.

Materials known in the art can be selected appropriately and used as materials for the anode. Conductive metal oxide films, semitransparent metal thin films, or the like are usually used. Examples thereof specifically include a film (NESA, etc.) prepared using conductive glass comprising indium oxide, zinc oxide, tin oxide and their complex indium tin oxide (ITO) or indium zinc oxide, and the like. Gold, platinum, silver, copper, or the like is also used. ITO, indium zinc oxide and tin oxide are preferable. Examples of the preparation method include vacuum deposition, sputtering, ion plating and plating methods. Alternatively, transparent organic conductive films such as polyaniline or derivatives thereof and polythiophene or derivatives thereof may be used as the anode. In this context, the anode may have a double- or more layered structure.

Materials known in the art can be selected appropriately and used as materials for the cathode. Materials having a small work function are usually preferable. For example, metals such as lithium, sodium, potassium, rubidium, cesium, beryllium, magnesium, calcium, strontium, barium, aluminum, scandium, vanadium, zinc, yttrium, indium, cerium, samarium, europium, terbium and ytterbium, and alloys of two or more thereof or alloys of one or more thereof with one or more of gold, silver, platinum, copper, manganese, titanium, cobalt, nickel, tungsten and tin, and graphite or intercalated graphite are used. Specific examples of the alloys include magnesium-silver, magnesium-indium, magnesium-aluminum, indium-silver, lithium-aluminum, lithium-magnesium, lithium-indium and calcium-aluminum alloys. In this context, the cathode may have a double—or more layered structure.

The light-emitting device of the present invention can be used, for example, in a planar light source and a display device (for example, a segment display device, a dot matrix display device, a liquid-crystal display device, etc.) or as a backlight thereof (for example, a liquid-crystal display device comprising the light-emitting device as a backlight).

To obtain planar light emission using the light-emitting device of the present invention, planar anode and cathode need only to be arranged such that they overlap with each other. Moreover, to obtain patterned light emission, methods are used which include: a method comprising placing a mask provided with a window with the pattern on the surface of the planar light-emitting device; a method comprising forming an extremely thick organic layer of a non-light-emitting portion such that the portion becomes substantially non-light-emitting; and a method comprising forming the pattern on either of the anode and the cathode or both of the electrodes. The pattern is formed by any of these methods, and some electrodes are arranged such that they can independently be switched between the ON and OFF positions. As a result, a segment-type display device is obtained which can display numbers, letters, simple symbols, and so on. Furthermore, to obtain a dot matrix device, both the anode and cathode need only to be formed in a striped form and arranged orthogonally. Partial color display or multicolor display is achieved by a method comprising separately applying a plurality of types of polymer phosphors differing in the color of emitted light or by a method using a color filter or a fluorescence conversion filter. The dot matrix device can be driven passively or may be driven actively in combination with TFT or the like. These display devices can be used as display devices for computers, televisions, mobile terminals, cellular phones, car navigation systems, video camera view finders, and so on.

Furthermore, the planar light-emitting device is usually a self-emitting, thin device and can be used preferably, for example, as a planar light source for backlights in liquid-crystal display devices or as illumination (e.g., planar illumination or a light source for the illumination). Moreover, the planar light-emitting device can be used as a light source, illumination, a display device, etc. having a curved surface, when a flexible substrate is used therein.

The composition, etc., of the present invention are not only useful in the preparation of devices but also can be used, for example, as a semiconductor material (e.g., an organic semiconductor material), a light-emitting material, an optical material or a conductive material (e.g., which is applied by doping). Thus, the composition, etc., of the present invention can be used to prepare films such as light-emitting thin films, conductive thin films and organic semiconductor thin films.

The composition, etc., of the present invention can be used to form conductive thin films and semiconductor thin films and make them into devices in the same way as in the method for preparing a light-emitting thin film used as the light-emitting layer in the light-emitting device. For the semiconductor thin films, it is preferred that, of electron mobility and hole mobility, the larger one should have $10^{-5}$ cm$^2$/V/second or larger. Moreover, the organic semiconductor thin films can be used in organic solar cells, organic transistors, and so on.

EXAMPLES

Hereinafter, the present invention will be described more specifically with reference to Examples. However, the present invention is not intended to be limited to them.

Example 1

A polymer (P-1) represented by the following formula:

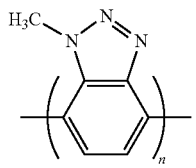

(P-1)

wherein n is the degree of polymerization,
had the lowest triplet excitation energy $T_1$ (1/n=0) of 2.9 eV as an extrapolated value at n=∞, an absolute value of the lowest unoccupied molecular orbital energy level $E_{LUMO}$ (1/n=0) of 2.5 eV, and the smallest dihedral angle of 65°.

The parameter calculation was conducted by a computational chemical approach described in Detailed Description of the Invention. Specifically, the structure was optimized according to an HF method using the following repeating unit (M-1) in the polymer (P-1) wherein n=1, 2 and 3:

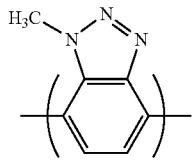

(M-1)

In this procedure, 6-31G* was used as a basis function. Then, the lowest unoccupied molecular orbital energy level and the lowest triplet excitation energy were calculated by a time-dependent density functional method at a B3P86 level using the same basis function. The lowest unoccupied molecular orbital energy level and the lowest triplet excitation energy calculated at each n were used as a function of the reciprocal of n, (1/n), while the extrapolated value at n=∞ was used as a value at 1/n=0 of the function.

Moreover, the dihedral angle was calculated from the optimized structure of a structure wherein n=3 (n is the degree of polymerization). The compound has a plurality of the benzotriazole ring structures and therefore also has a plurality of the dihedral angles.

In this Example, only the lowest value among the plurality of the dihedral angles is described (hereinafter, the same holds true for Examples 2 to 10 and Comparative Example 1).

A light-emitting device prepared using a composition comprising the polymer (P-1) and a phosphorescence-emitting compound can be confirmed to be excellent in luminous efficiency.

Example 2

A compound (C-1) represented by the following formula:

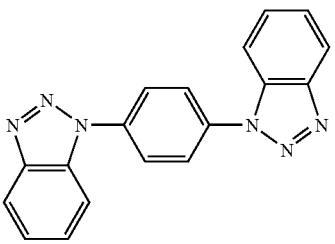

(C-1)

had excitation energy $T_1$ of 3.3 eV, an absolute value of the lowest unoccupied molecular orbital energy level $E_{LUMO}$ of 2.1 eV, and the smallest dihedral angle of 44°. The dihedral angle was calculated using the optimized structure of the compound (C-1). The parameter calculation was conducted using the same computational chemical approach as in Example 1.

A light-emitting device prepared using a composition comprising the compound (C-1) and a phosphorescence-emitting compound can be confirmed to be excellent in luminous efficiency.

Example 3

A compound (C-2) represented by the formula shown below had the lowest triplet excitation energy $T_1$ of 3.3 eV, an absolute value of the lowest unoccupied molecular orbital energy level $E_{LUMO}$ of 2.2 eV, and the smallest dihedral angle of 35°. The dihedral angle was calculated using the optimized structure of the compound (C-2). The parameter calculation was conducted using the same computational chemical approach as in Example 1.

A light-emitting device prepared using a composition comprising the compound (C-2) and a phosphorescence-emitting compound can be confirmed to be excellent in luminous efficiency.

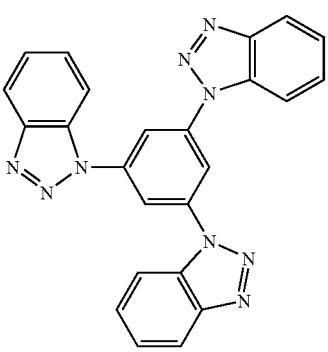

(C-2)

Example 4

A polymer (P-2) represented by the following formula:

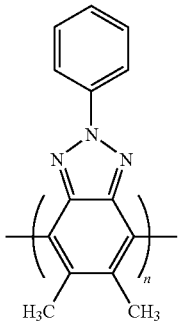

(P-2)

wherein n is the degree of polymerization,
had the lowest triplet excitation energy $T_1$ (1/n=0) of 2.7 eV as an extrapolated value at n=∞ and an absolute value of the lowest unoccupied molecular orbital energy level $E_{LUMO}$ (1/n=0) of 2.1 eV, and the smallest dihedral angle of 78°.

The parameter calculation was conducted in the same way as in Example 1 using the following repeating unit (M-2) in the polymer (P-2):

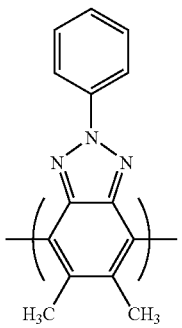

(M-2)

A light-emitting device prepared using a composition comprising the polymer (P-1) and a phosphorescence-emitting compound can be confirmed to be excellent in luminous efficiency.

Example 5

A compound (C-3) represented by the following formula:

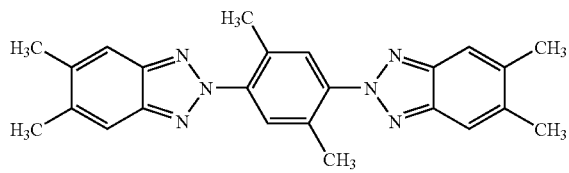

(C-3)

had the lowest triplet excitation energy $T_1$ of 2.9 eV, an absolute value of the lowest unoccupied molecular orbital energy level $E_{LUMO}$ of 2.2 eV, and the smallest dihedral angle of 41°. The dihedral angle was calculated using the optimized structure of the compound (C-3). The parameter calculation was conducted using the same computational chemical approach as in Example 1.

A light-emitting device prepared using a composition comprising the compound (C-3) and a phosphorescence-emitting compound can be confirmed to be excellent in luminous efficiency.

Comparative Example 1

A polymer (P-4) represented by the following formula:

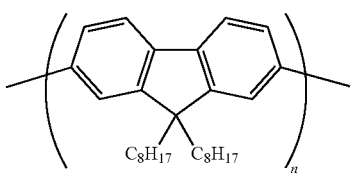

(P-4)

wherein n is the degree of polymerization,
had the lowest triplet excitation energy $T_1$ (1/n=0) of 2.6 eV as an extrapolated value at n=∞, an absolute value of the lowest unoccupied molecular orbital energy level $E_{LUMO}$ (1/n=0) of 2.1 eV, and the smallest dihedral angle of 45°. The parameter calculation was conducted in the same way as in Example 1 by simplifying the repeating unit (M-4) shown below in the polymer (P-4) to the structure (M-4-a). The validity of the simplified chemical structure was confirmed according to a method described in JP-A-2005-126686 based on the small alkyl side chain length dependence of the lowest triplet excitation energy and the lowest unoccupied molecular orbital energy level.

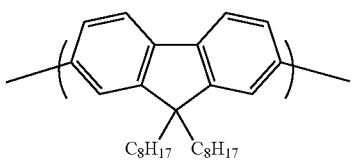

(M-4)

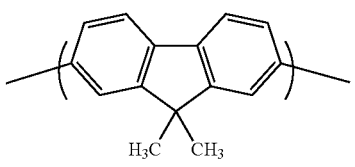

(M-4a)

A light-emitting device prepared using a composition comprising the polymer (P-4) and a phosphorescence-emitting compound can be confirmed to inferior in luminous efficiency to the light-emitting devices prepared in Examples 1 to 12.

Example 6

A 0.05 wt % THF solution of a phosphorescence-emitting compound (MC-1) represented by the following formula:

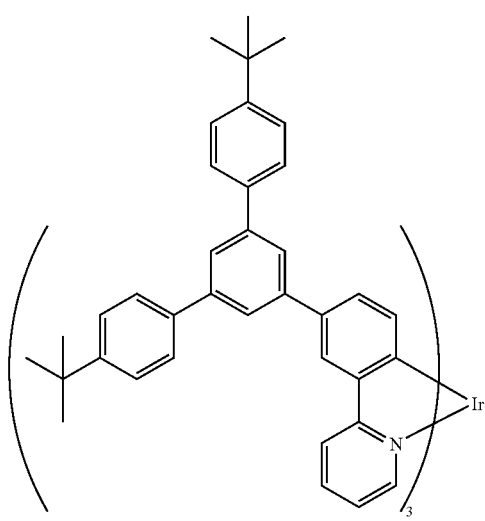

(MC-1)

was mixed with an approximately 5-fold weight of an approximately 1 wt % THF solution of a compound represented by the following formula (C-4):

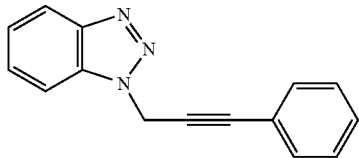

(C-4)

A 10 μl aliquot of the obtained solution was added dropwise to a slide glass and dried in air to obtain a solid film. This film was irradiated with UV rays at 365 nm. As a result, green light emission from the phosphorescence-emitting compound (MC-1) was confirmed.

The compound represented by the formula (C-4) had the lowest triplet excitation energy $T_1$ of 3.4 eV and an absolute value of the lowest unoccupied molecular orbital energy level $E_{LUMO}$ of 1.6 eV.

In this context, the compound represented by the formula (MC-1) was synthesized according to a method described in WO02/066552.

Example 7

A 0.05 wt % THF solution of the phosphorescence-emitting compound (MC-1) was mixed with an approximately 5-fold weight of an approximately 1 wt % THF solution of a compound represented by the following formula (C-5):

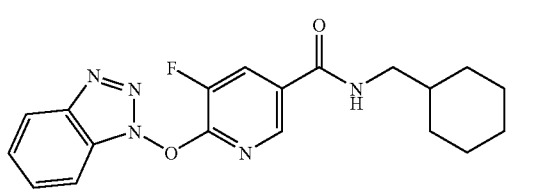

(C-5)

A 10 μl aliquot of the obtained solution was added dropwise to a slide glass and dried in air to obtain a solid film. This film was irradiated with UV rays at 365 nm. As a result, green light emission from the phosphorescence-emitting compound (MC-1) was confirmed.

The compound represented by the formula (C-5) had the lowest triplet excitation energy $T_1$ of 3.4 eV and an absolute value of the lowest unoccupied molecular orbital energy level $E_{LUMO}$ of 2.0 eV.

Example 8

A 0.05 wt % THF solution of the phosphorescence-emitting compound (MC-1) was mixed with an approximately 5-fold weight of an approximately 1 wt % THF solution of a compound represented by the following formula (C-6):

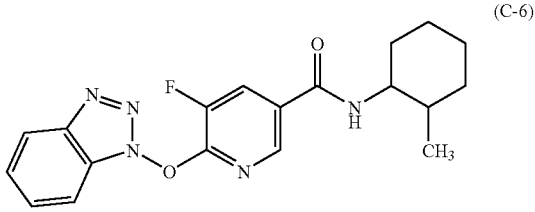

(C-6)

A 10 μl aliquot of the obtained solution was added dropwise to a slide glass and dried in air to obtain a solid film. This film was irradiated with UV rays at 365 nm. As a result, green light emission from the phosphorescence-emitting compound (MC-1) was confirmed.

The compound represented by the formula (C-6) had the lowest triplet excitation energy $T_1$ of 3.4 eV and an absolute value of the lowest unoccupied molecular orbital energy level $E_{LUMO}$ of 2.0 eV.

Example 9

A 0.05 wt % THF solution of the phosphorescence-emitting compound (MC-1) was mixed with an approximately 5-fold weight of an approximately 1 wt % THF solution of a compound represented by the following formula (C-7):

(C-7)

A 10 μl aliquot of the obtained solution was added dropwise to a slide glass and dried in air to obtain a solid film. This film was irradiated with UV rays at 365 nm. As a result, green light emission from the phosphorescence-emitting compound (MC-1) was confirmed.

The compound represented by the formula (C-7) had the lowest triplet excitation energy $T_1$ of 3.3 eV and an absolute value of the lowest unoccupied molecular orbital energy level $E_{LUMO}$ of 2.6 eV.

Example 10

A 0.05 wt % THF solution of the phosphorescence-emitting compound (MC-1) was mixed with an approximately 5-fold weight of an approximately 1 wt % THF solution of a compound represented by the following formula (C-8):

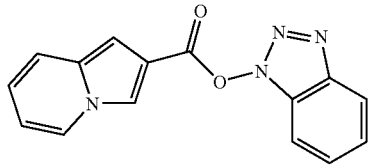
(C-8)

A 10 μl aliquot of the obtained solution was added dropwise to a slide glass and dried in air to obtain a solid film. This film was irradiated with UV rays at 365 nm. As a result, green light emission from the phosphorescence-emitting compound (MC-1) was confirmed.

The compound represented by the formula (C-8) had the lowest triplet excitation energy $T_1$ of 2.7 eV and an absolute value of the lowest unoccupied molecular orbital energy level $E_{LUNO}$ of 2.0 eV.

Example 11

A solution was prepared in the same way as in Example 7 except that a phosphorescence-emitting compound (MC-2) shown below was used instead of the phosphorescence-emitting compound (MC-1) in Example 7. The solution was irradiated with UV rays. As a result, light emission from the phosphorescence-emitting compound (MC-2, manufactured by American Dye Source, Inc., trade name: ADS065BE) was confirmed.

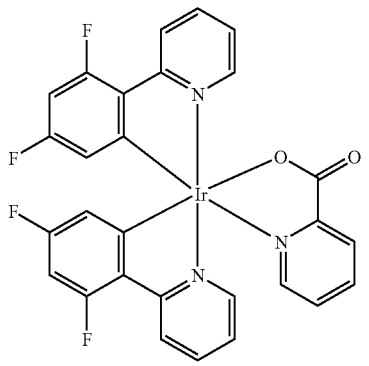
(MC-2)

Example 12

A solution was prepared in the same way as in Example 8 except that the phosphorescence-emitting compound (MC-2) shown below was used instead of the phosphorescence-emitting compound (MC-1) in Example 8. The solution was irradiated with UV rays. As a result, light emission from the phosphorescence-emitting compound (MC-2) was confirmed.

Comparative Example 2

A 10 μl aliquot of the mixed solution comprising the compound (P-4) and the phosphorescence-emitting compound (MC-1) was added dropwise to a slide glass and dried in air to obtain a solid film. This film was irradiated with UV rays at 365 nm. As a result, light emission was darker than that from the compound (P-4), and difference in color was hardly observed.

INDUSTRIAL APPLICABILITY

A composition and a polymer of the present invention give light-emitting devices excellent in luminous efficiency, when used in the preparation of light-emitting devices or the like.

The invention claimed is:

1. A composition comprising a compound having a benzotriazole ring structure and a phosphorescence-emitting compound,
    wherein the compound having a benzotriazole ring structure has the lowest triplet excitation energy of 2.7 eV or larger calculated by a computational chemical approach and has an absolute value of the lowest unoccupied molecular orbital energy level of 2.0 eV or larger calculated by a computational chemical approach.

2. The composition according to claim 1, wherein the compound having a benzotriazole ring structure has at least one benzotriazole ring structure selected from the following general formulas (1-1), (1-2), (1-3), (1-4), (2-1), (2-2), (2-3), (3-1), (3-2), (3-3), (3-4), (4-1) and (4-2):

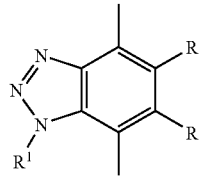
(1-1)

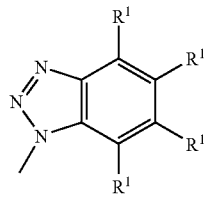
(1-2)

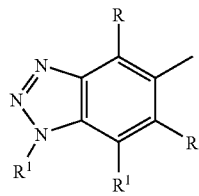
(1-3)

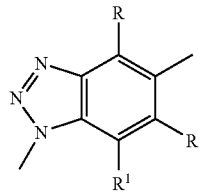
(1-4)

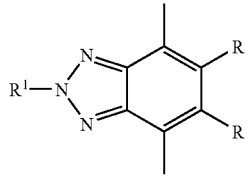
(2-1)

-continued (2-2)
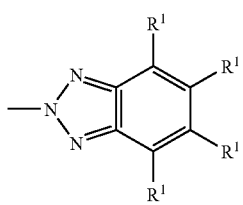

(2-3)
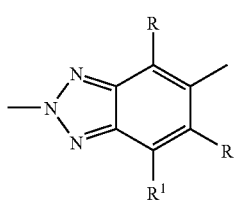

(3-1)
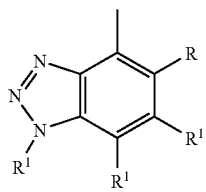

(3-2)
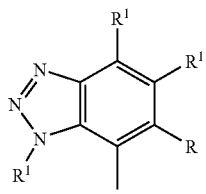

(3-3)
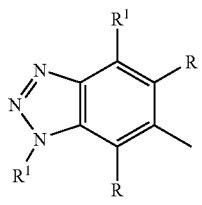

(3-4)
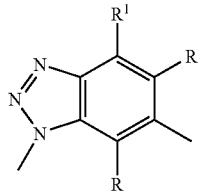

(4-1)
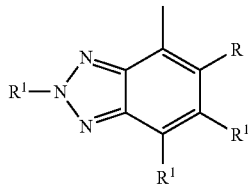

(4-2)
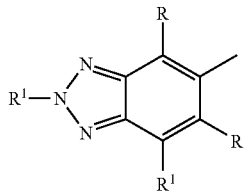

wherein R and $R^1$ each independently represent a hydrogen atom or a monovalent substituent, and when a plurality of R or $R^1$ are present, they may be the same or different.

3. The composition according to claim 1, wherein the lowest triplet excitation energy (ETP) of the compound having a benzotriazole ring structure satisfies, with a lowest triplet excitation energy (ETT) of the phosphorescence-emitting compound, the following formula:

ETT>ETP−0.5 (eV).

4. The composition according to claim 1 wherein the compound having a benzotriazole ring structure is a compound represented by the following general formula (A-1) or (A-2) or a compound having a residue thereof:

 (A-1)

 (A-2)

wherein bnztrzl represents a benzotriazole ring structure represented by the general formula (1-2), (1-3), (2-2), (3-1), (3-2), (3-3) or (4-2):

(1-2)

(1-3)
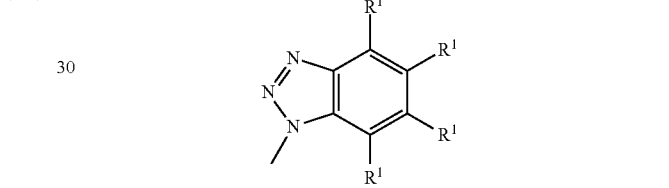

(2-2)
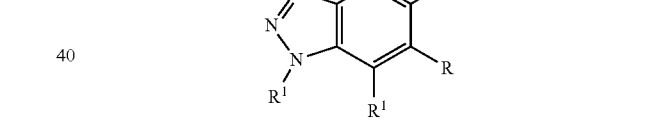

(3-1)
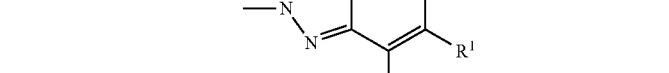

(3-2)
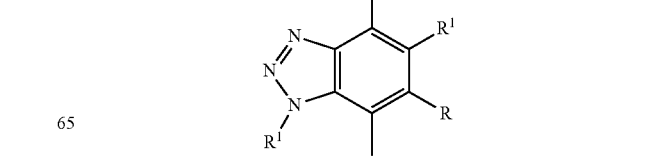

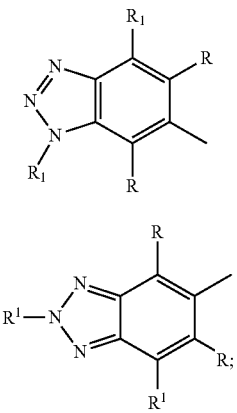
(3-3)

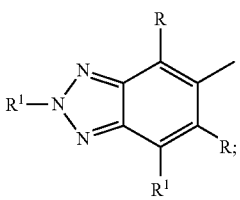
(4-2)

and R and R$^1$ each independently represent a hydrogen atom or a monovalent substituent, and when a plurality of R or R$^1$ are present, they may be the same or different; when a plurality of bnztrzl are present, they may be the same or different; Y$^1$ represents —C(R$^a$)(R$^b$)—, —C(=O)—, —N(R$^c$)—, —O—, —Si(R$^d$)(R$^e$)—, —P(R$^f$)—, —S— or —S(=O)$_2$—; n is an integer of 0 to 5;

Ar$_1$ represents an aryl group which may have a substituent or a monovalent heterocyclic group which may have a substituent; when a plurality of Y$^1$ are present, they may be the same or different; and R$^a$ to R$^f$ each independently represent a hydrogen atom or a monovalent substituent.

5. The composition according to claim 1, wherein the compound having a benzotriazole ring structure is represented by the following general formula (6a), (6b) or (6c):

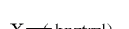  (6a)

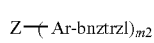  (6b)

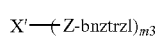  (6c)

wherein bnztrzl represents a benzotriazole ring structure represented by the general formula (1-2), (1-3), (2-2), (3-1), (3-2), (3-3) or (4-2):

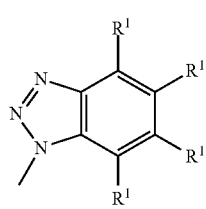
(1-2)

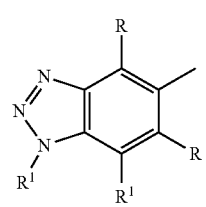
(1-3)

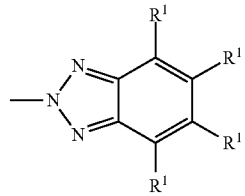
(2-2)

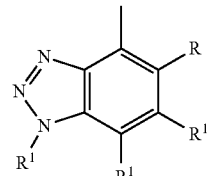
(3-1)

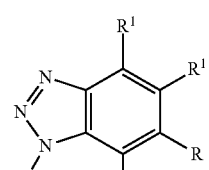
(3-2)

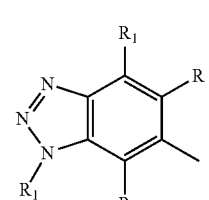
(3-3)

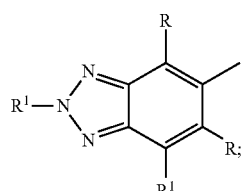
(4-2)

and R and R$^1$ each independently represent a hydrogen atom or a monovalent substituent, and when a plurality of R or R$^1$ are present, they may be the same or different;

X represents a m1-valent aromatic group which may have a substituent or a m1-valent aromatic heterocyclic group which may have a substituent; X' represents a m3-valent aromatic group which may have a substituent or a m3-valent aromatic heterocyclic group which may have a substituent; Ar represents an arylene group which may have a substituent; Z represents a linking group; m1, m2 and m3 are each independently an integer of 2 to 8; when a plurality of Z are present, they may be the same or different; and a plurality of Ar or bnztrzl may be the same or different.

6. The composition according to claim 2, wherein the compound having a benzotriazole ring structure has a benzotriazole ring structure represented by the general formula (1-1), (1-2), (1-3), (1-4), (2-1), (2-2), (2-3), (3-1), (3-2), (3-3), (3-4), (4-1) or (4-2) and a partial structure adjacent to the benzotriazole ring structure, the partial structure having at least two π-conjugated electrons, wherein the benzotriazole ring structure and the partial structure form a dihedral angle of 20° or larger therebetween.

7. The composition according to claim 2, wherein at least one of the R and the R$^1$ is an alkyl group, an alkoxy group, an aryl group which may have a substituent or a heteroaryl group which may have a substituent.

8. The composition according to claim 2, wherein at least one of the plurality of R and the plurality of $R^1$ is an alkyl group having 3 to 10 carbon atoms or an alkoxy group having 3 to 10 carbon atoms.

9. The composition according to claim 8, wherein at least one of the R is a monovalent substituent having a total of three or more atoms exclusive of hydrogen atoms.

10. The composition according to claim 1, wherein the compound having a benzotriazole ring structure is a polymer.

11. A polymer having a residue of a phosphorescence-emitting compound and a benzotriazole ring structure.

12. A light-emitting thin film using a composition according to claim 1.

13. An organic semiconductor thin film using a composition according to claim 1.

14. A light-emitting device using a composition according to claim 1.

15. A planar light source comprising a light-emitting device according to claim 14.

16. A segment display device comprising a light-emitting device according to claim 14.

17. A dot matrix display device comprising a light-emitting device according to claim 14.

18. A liquid-crystal display device comprising a light-emitting device according to claim 14 as a backlight.

19. Illumination comprising a light-emitting device according to claim 14.

* * * * *